(12) United States Patent
Sato

(10) Patent No.: US 10,115,897 B1
(45) Date of Patent: Oct. 30, 2018

(54) RESISTIVE MEMORY CELL CONTAINING A MIDDLE ELECTRODE AND METHOD OF MAKING THE SAME

(71) Applicant: SANDISK TECHNOLOGIES LLC, Plano, TX (US)

(72) Inventor: Yoshihiro Sato, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/805,627

(22) Filed: Nov. 7, 2017

(51) Int. Cl.
   *H01L 45/00* (2006.01)
   *H01L 27/24* (2006.01)

(52) U.S. Cl.
   CPC ...... *H01L 45/1253* (2013.01); *H01L 27/2454* (2013.01); *H01L 45/1608* (2013.01)

(58) Field of Classification Search
   CPC ............. H01L 27/2454; H01L 27/2472; H01L 27/249
   See application file for complete search history.

(56) References Cited

U.S. PATENT DOCUMENTS

| 9,343,507 | B2 | 5/2016 | Takaki |
| 9,437,658 | B2* | 9/2016 | Sakotsubo .......... H01L 45/1253 |
| 9,793,139 | B2 | 10/2017 | Sharangpani et al. |
| 9,859,337 | B2* | 1/2018 | Ratnam ............... H01L 27/2481 |
| 2002/0028541 | A1 | 3/2002 | Lee et al. |
| 2013/0043455 | A1* | 2/2013 | Bateman ............. H01L 27/2454 257/5 |
| 2015/0263074 | A1 | 9/2015 | Takaki |
| 2017/0092733 | A1 | 3/2017 | Makala et al. |
| 2017/0125538 | A1 | 5/2017 | Sharangpani et al. |
| 2017/0141161 | A1 | 5/2017 | Sakotsubo |

FOREIGN PATENT DOCUMENTS

WO WO2007004843 A1 1/2007

OTHER PUBLICATIONS

Itoh, H. et al. "Low Pressure Chemical Vapor Deposition of Tungsten," ULSI Researcher Center, Toshiba Corp, Applied Physics, vol. 61, No. 11, pp. 1132-1138, (1992).
U.S. Appl. No. 15/332,429, filed Oct. 24, 2016, SanDisk Technologies LLC.
U.S. Appl. No. 15/730,045, filed Oct. 11, 2017, SanDisk Technologies LLC.

* cited by examiner

*Primary Examiner* — Allison P Bernstein
(74) *Attorney, Agent, or Firm* — The Marbury Law Group PLLC

(57) ABSTRACT

A resistive memory device includes an alternating stack of insulating layers and electrically conductive layers. Sidewalls of the electrically conductive layers are laterally recessed relative to sidewalls of the insulating layers to define laterally recessed regions. Discrete clam-shaped barrier material portions are located within the laterally recessed regions. Middle electrodes include a protrusion portion embedded within a respective one of the discrete clam shaped barrier material portions and a vertically-extending portion located outside the laterally recessed regions and having a greater vertical extent than the embedded portion. A resistive memory material layer contacts the vertically-extending portion of each of the middle electrodes. A vertical conductive line contacts the resistive memory material layer.

19 Claims, 30 Drawing Sheets

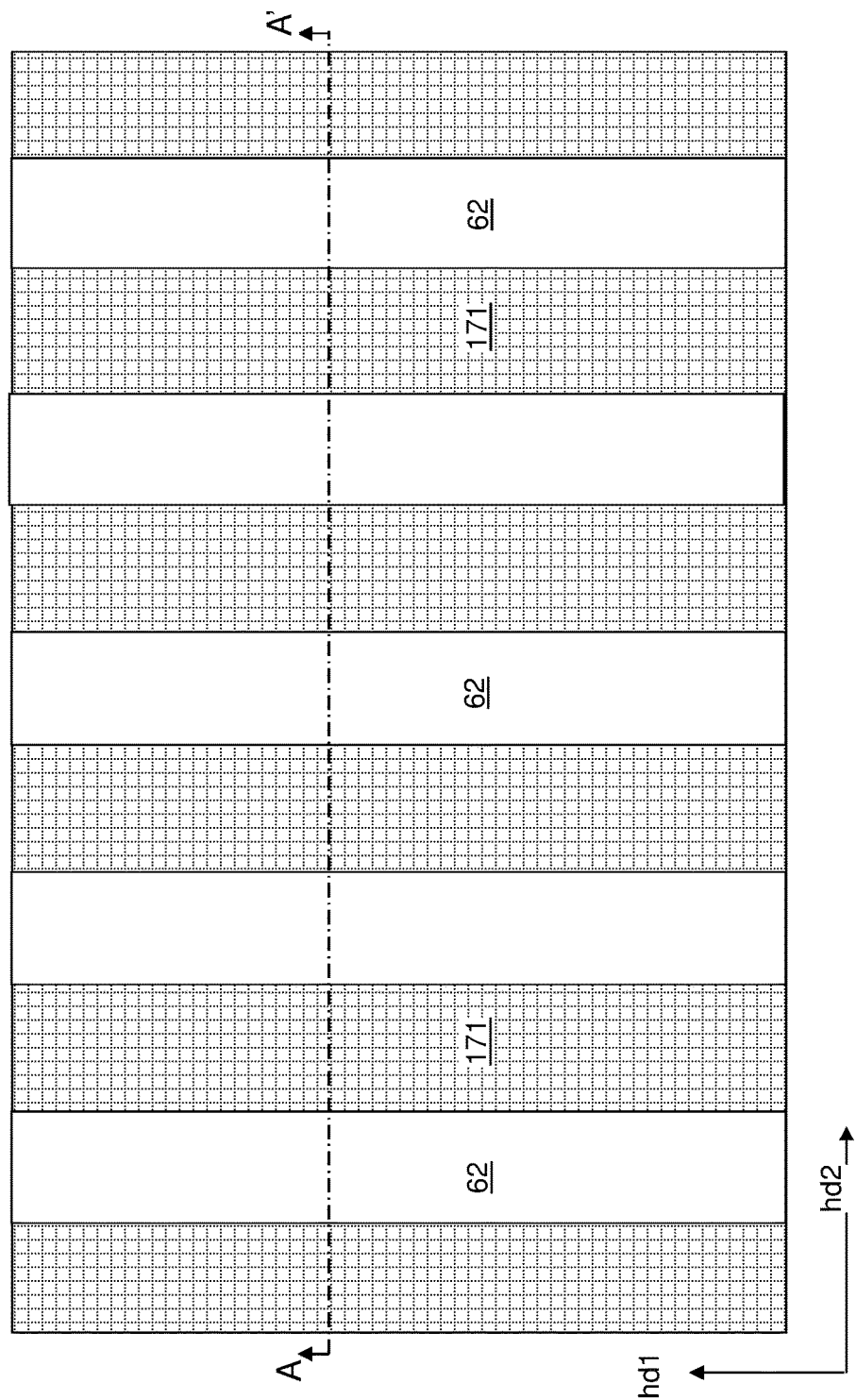

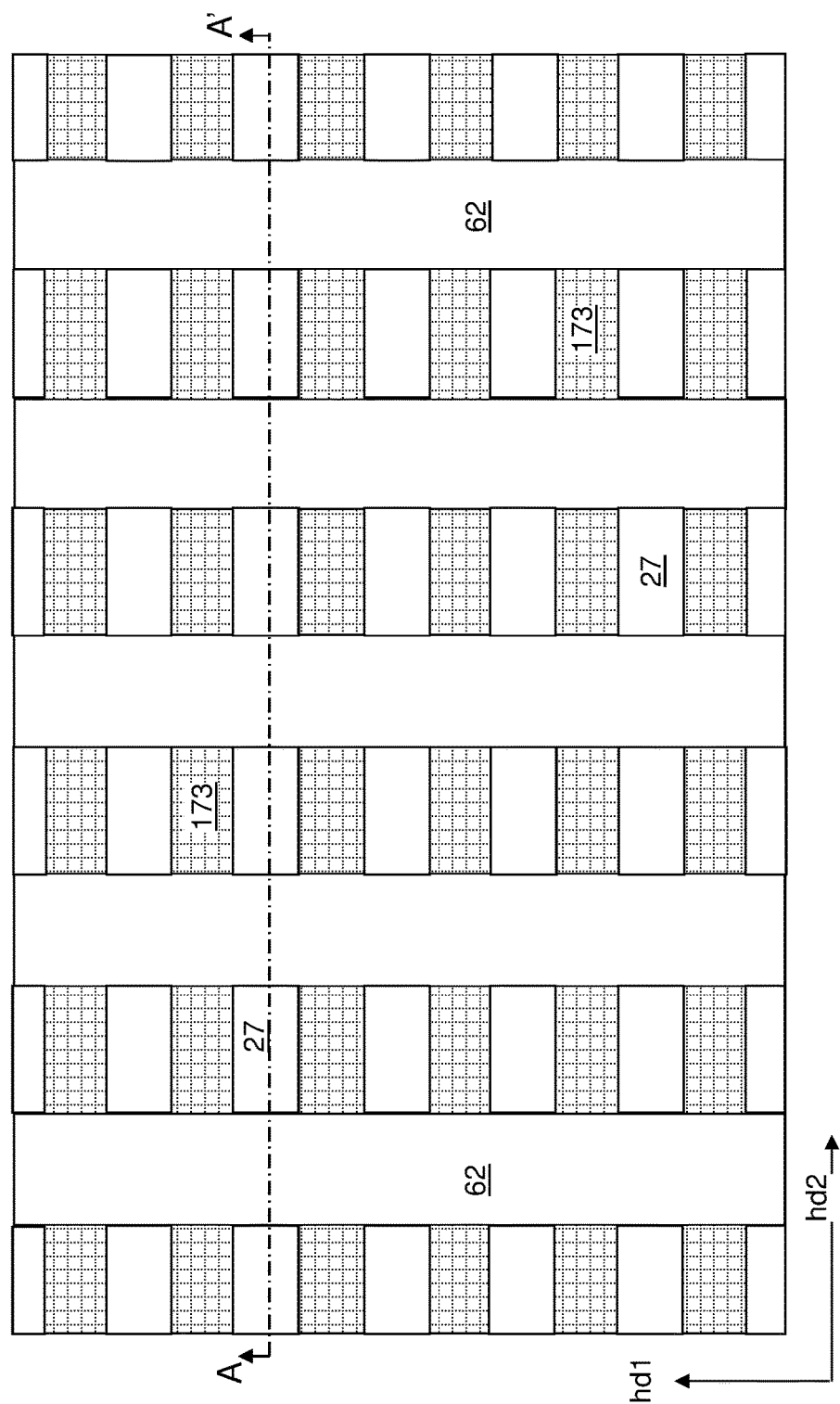

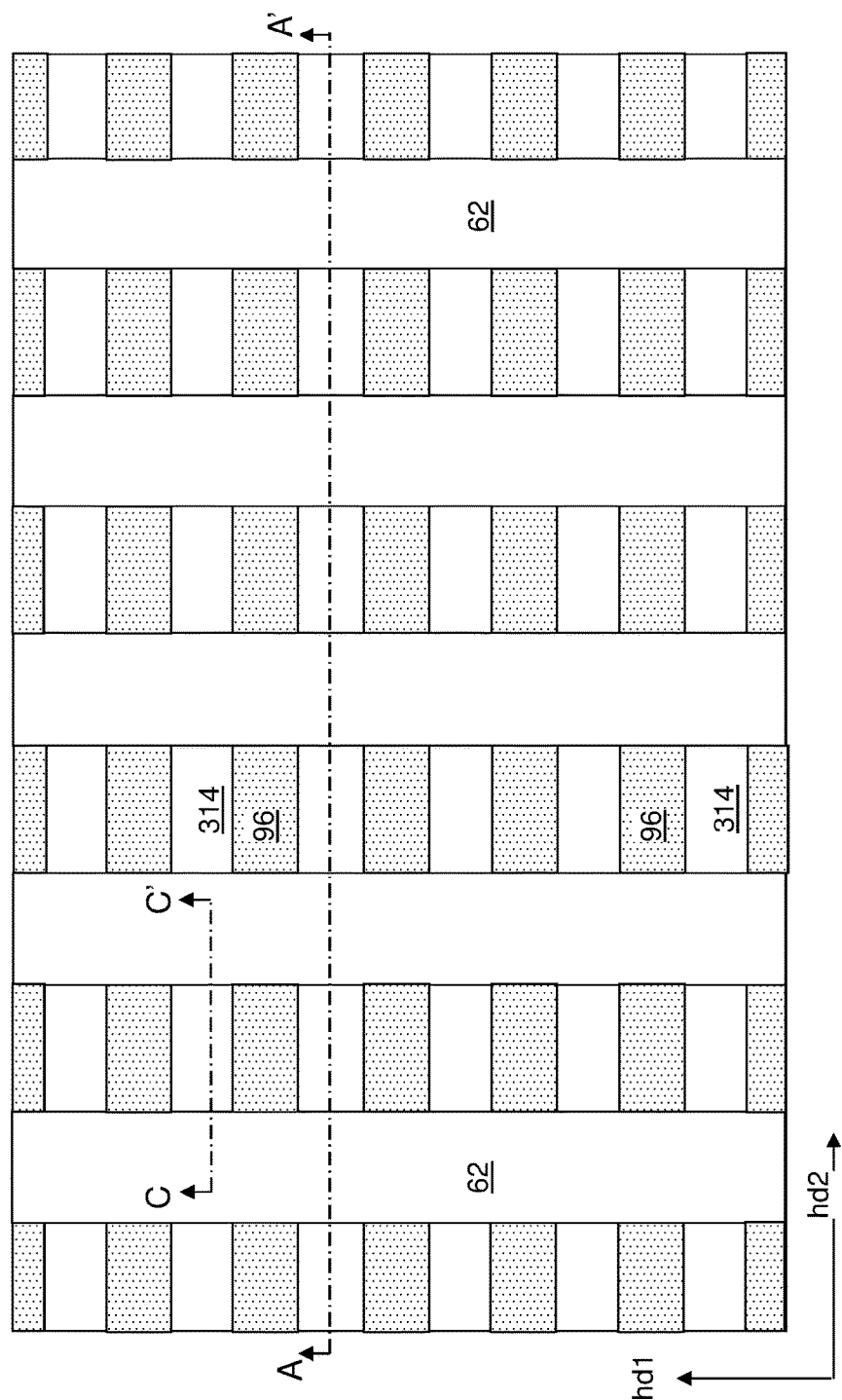

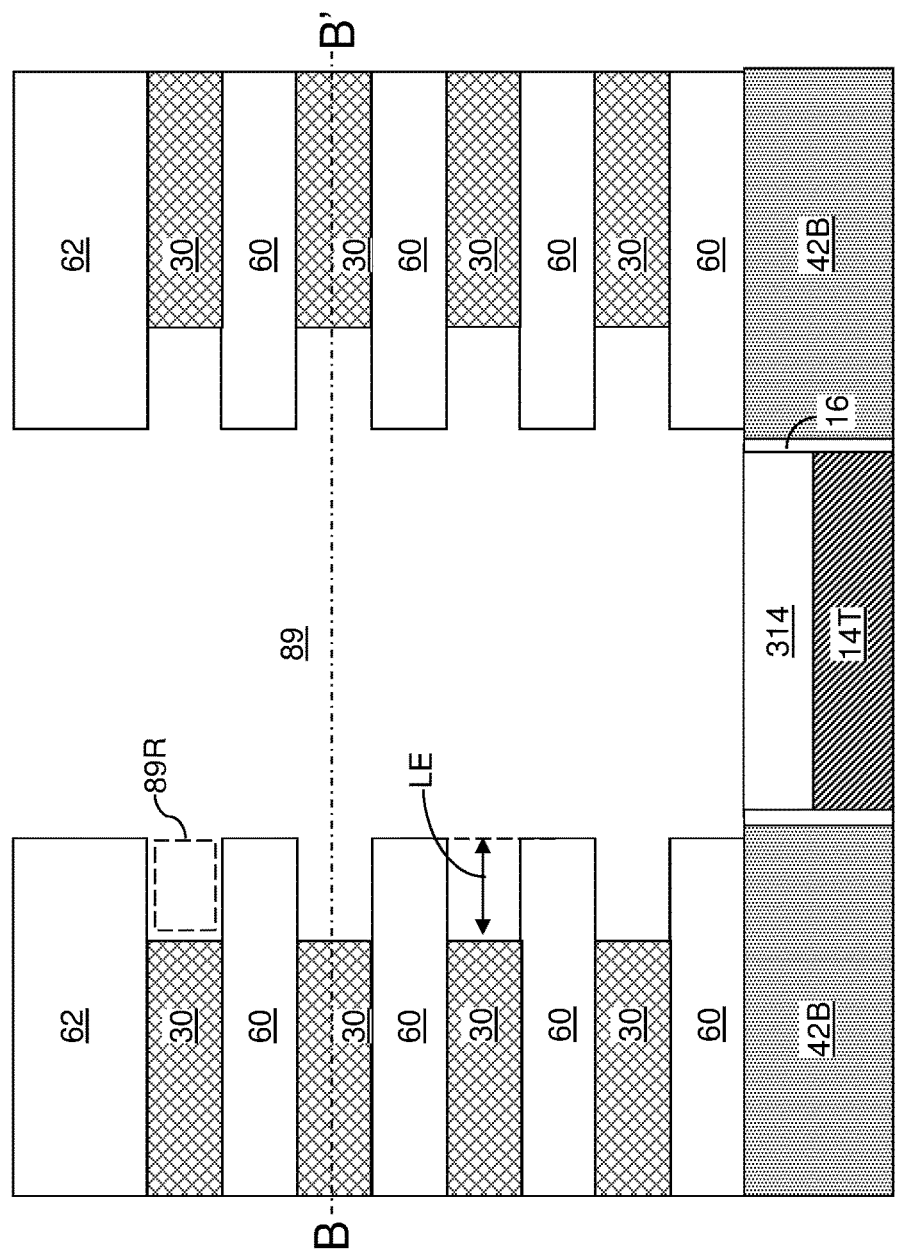

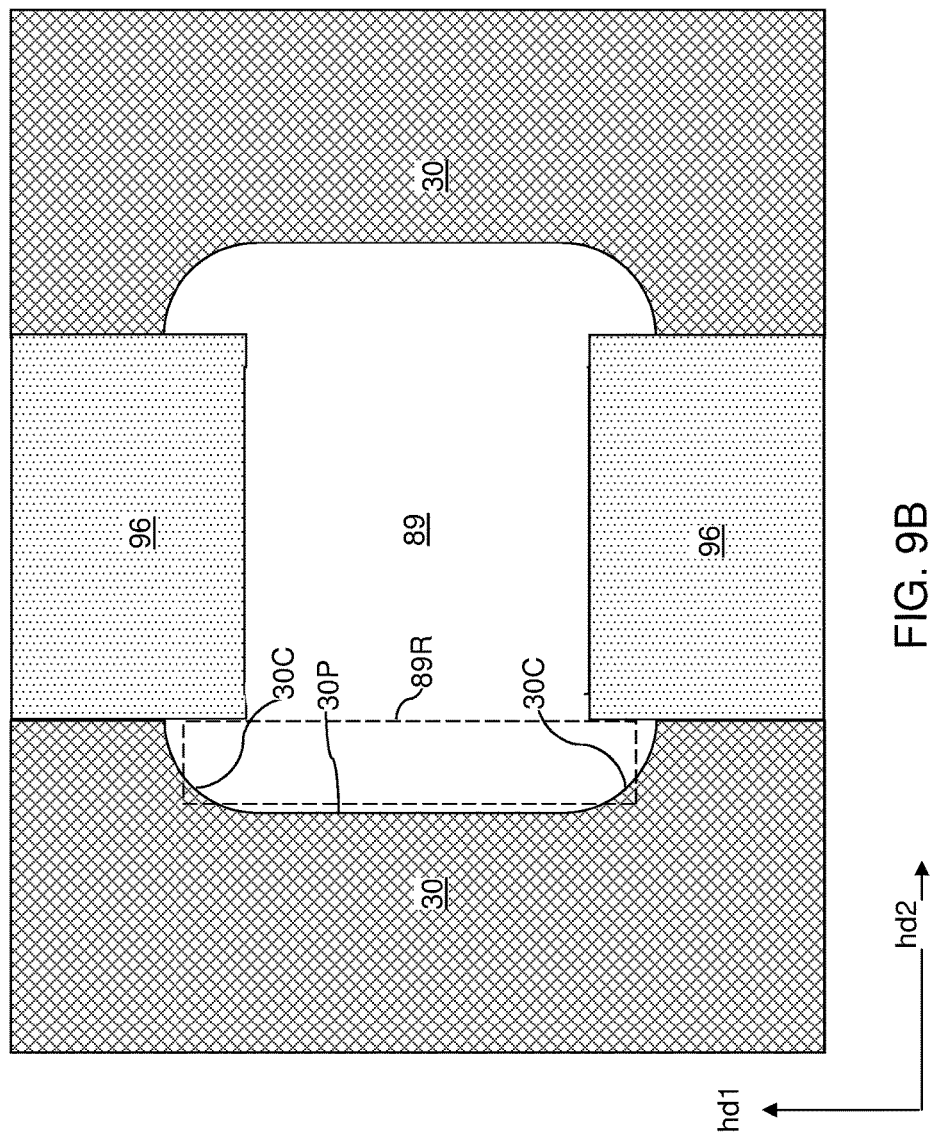

RESISTIVE MEMORY CELL CONTAINING A MIDDLE ELECTRODE AND METHOD OF MAKING THE SAME

FIELD

The present disclosure relates generally to the field of semiconductor devices and specifically to a resistive memory cell containing a middle electrode and methods of manufacturing the same.

BACKGROUND

Resistance Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a resistive memory device is provided, which comprises: an alternating stack of insulating layers and electrically conductive layers that extend along a first horizontal direction, wherein sidewalls of the electrically conductive layers are laterally recessed relative to sidewalls of the insulating layers to define laterally recessed regions; discrete clam-shaped barrier material portions located within a respective one of the laterally recessed regions and vertically spaced apart by the insulating layers; middle electrodes contacting a respective one of the discrete clam shaped barrier material portions, wherein each of the middle electrodes includes a protrusion portion located inside a respective one of the laterally recessed regions and embedded within a respective one of the discrete clam shaped barrier material portions, and further includes a vertically-extending portion located outside the laterally recessed regions and having a greater vertical extent than the embedded portion; a resistive memory material layer comprising a resistive material having at least two resistive states having different electrical resistivity and contacting the vertically-extending portion of each of the middle electrodes; and a vertical conductive line contacting the resistive memory material layer.

According to another aspect of the present disclosure, a method of forming a resistive memory device is provided, which comprises forming an alternating stack of insulating layers and electrically conductive layers that extend along a first horizontal direction over a substrate; forming laterally recessed regions by laterally recessing sidewalls of the electrically conductive layers relative to sidewalls of the insulating layers; forming discrete clam-shaped barrier material portions within the laterally recessed regions, wherein a laterally-extending cavity is present within each of the laterally recessed regions after formation of the discrete clam-shaped barrier material portions; forming middle electrodes on the discrete clam shaped barrier material portions, wherein each of the middle electrodes includes a protrusion portion located inside a respective one of the laterally recessed regions and embedded within a respective one of the discrete clam shaped barrier material portions, and further includes a vertically-extending portion located outside the laterally recessed regions and having a greater vertical extent than the embedded portion; forming a resistive memory material layer comprising a resistive material having at least two resistive states having different electrical resistivity on the vertically-extending portion of each of the middle electrodes; and forming a vertical conductive line on the resistive memory material layer.

According to another aspect of the present disclosure, a method of forming a resistive memory device is provided, which comprises forming an alternating stack of insulating layers and electrically conductive layers that extend along a first horizontal direction over a substrate; forming laterally recessed regions by laterally recessing sidewalls of the electrically conductive layers relative to sidewalls of the insulating layers; forming discrete clam-shaped barrier material portions within the laterally recessed regions, wherein a laterally-extending cavity is present within each of the laterally recessed regions after formation of the discrete clam-shaped barrier material portions; selectively depositing a metallic material such that the metallic material selectively grows from surfaces of the discrete clam-shaped barrier material portions to form middle electrodes; forming a resistive memory material layer comprising a resistive material having at least two resistive states having different electrical resistivity on the middle electrodes; and forming a vertical conductive line on the resistive memory material layer.

BRIEF DESCRIPTION OF THE DRAWINGS

FIG. 4B is a top-down view of the exemplary structure of FIG. 4A. The vertical plane A-A' is the plane of the cross-section for FIG. 4A.

FIG. 5B is a top-down view of the exemplary structure of FIG. 5A. The vertical plane A-A' is the plane of the cross-section for FIG. 5A.

FIG. 7B is a top-down view of the exemplary structure of FIG. 7A. The vertical plane A-A' is the plane of the cross-section for FIG. 7A.

FIG. 9A is a vertical cross-sectional view of the exemplary structure after formation of laterally recessed regions according to an embodiment of the present disclosure.

FIG. 9B is a horizontal cross-sectional view of the exemplary structure along the plane B-B' of FIG. 9A.

DETAILED DESCRIPTION

Figure 1:
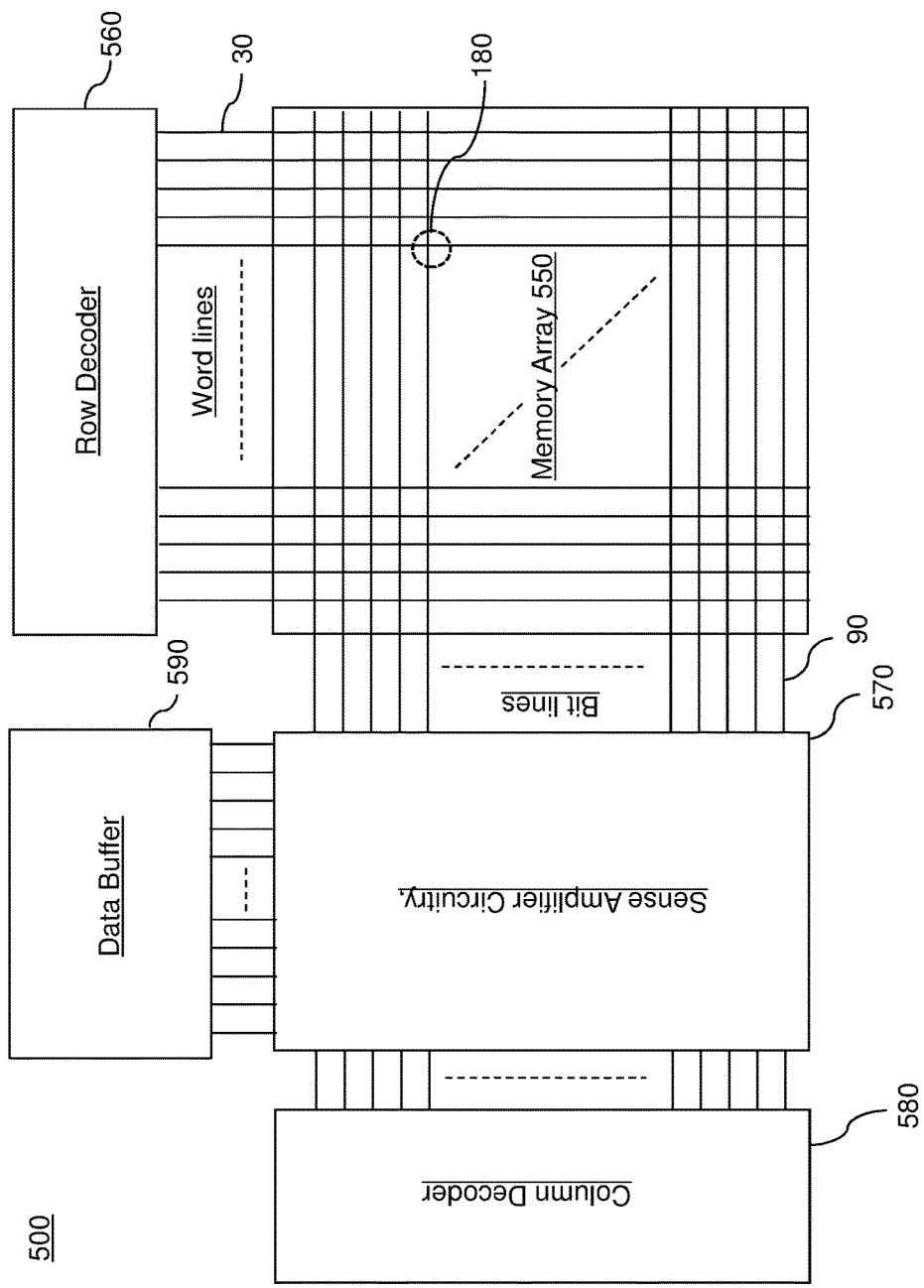
FIG. 1 is a schematic diagram of a memory device including resistive memory cells of the present disclosure in an array configuration.

As discussed above, the present disclosure is directed to a resistive memory cell containing a rivet-shaped middle electrode and methods of manufacturing the same, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, a sense circuitry 570 (e.g., a sense amplifier and other bit line control circuitry) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

Each resistive memory cell 180 includes a resistive memory material having at least two different resistive states. The resistive memory material portion is provided between a first electrode and a second electrode within each resistive memory cell 180. Configurations of the resistive memory cells 180 are described in detail in subsequent sections. The resistive memory material portion may include a non-filamentary barrier modulated cell (BMC), which includes a barrier and an electrically conductive metal oxide whose resistivity is switched by at least one of oxygen ion and/or oxygen vacancy diffusion in response to an application of an electric field thereto.

FIGS. 2A to 8 illustrate an exemplary processing sequence for forming an in-process device containing select transistors and alternating stacks of word line strips and insulating layer strips, which can be employed to form a ReRAM device having a three-dimensional vertical bit line ("VBL") configuration according to an embodiment of the present disclosure. As used herein, an "in-process" structure or a "prototype" structure refers to a transient structure that is subsequently modified in the shape or composition of at least one component therein.

Figure 2A:
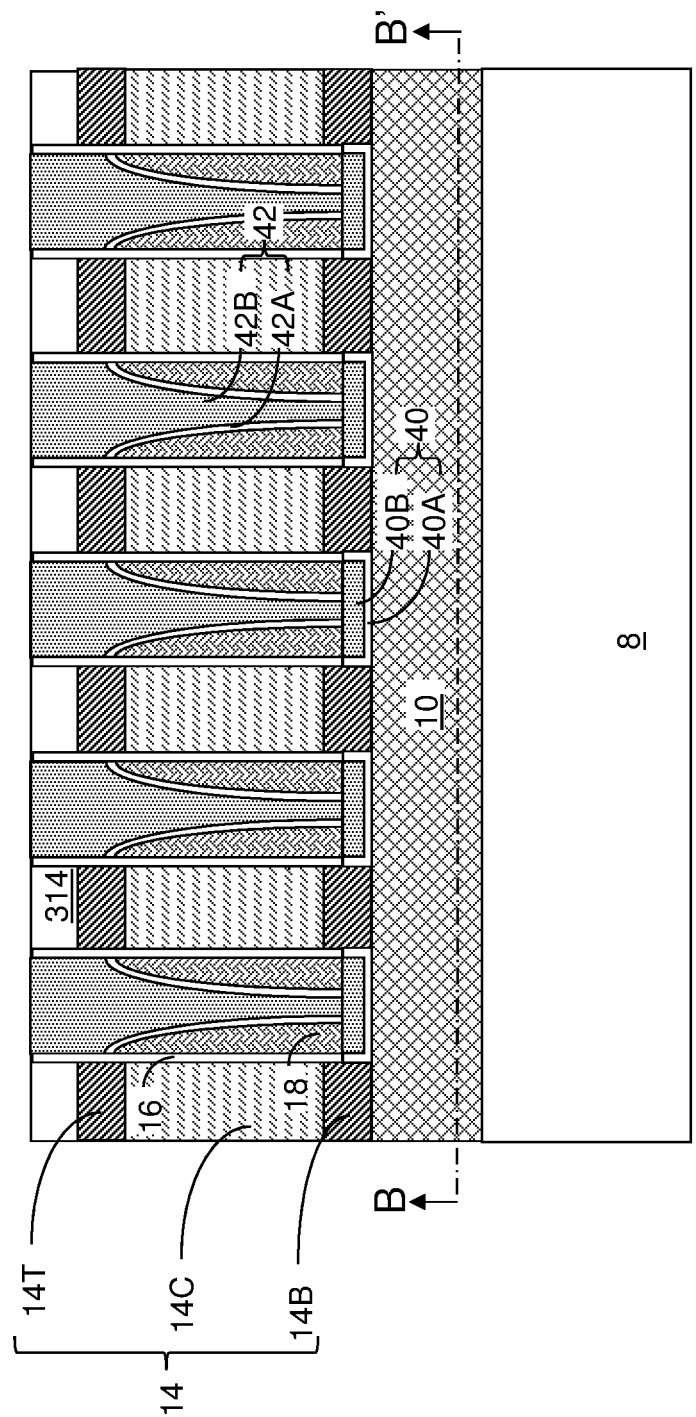
FIG. 2A is a vertical cross-sectional view of an exemplary structure after formation of bit line access transistors and dielectric fill layers according to an embodiment of the present disclosure.
Figure 2B:
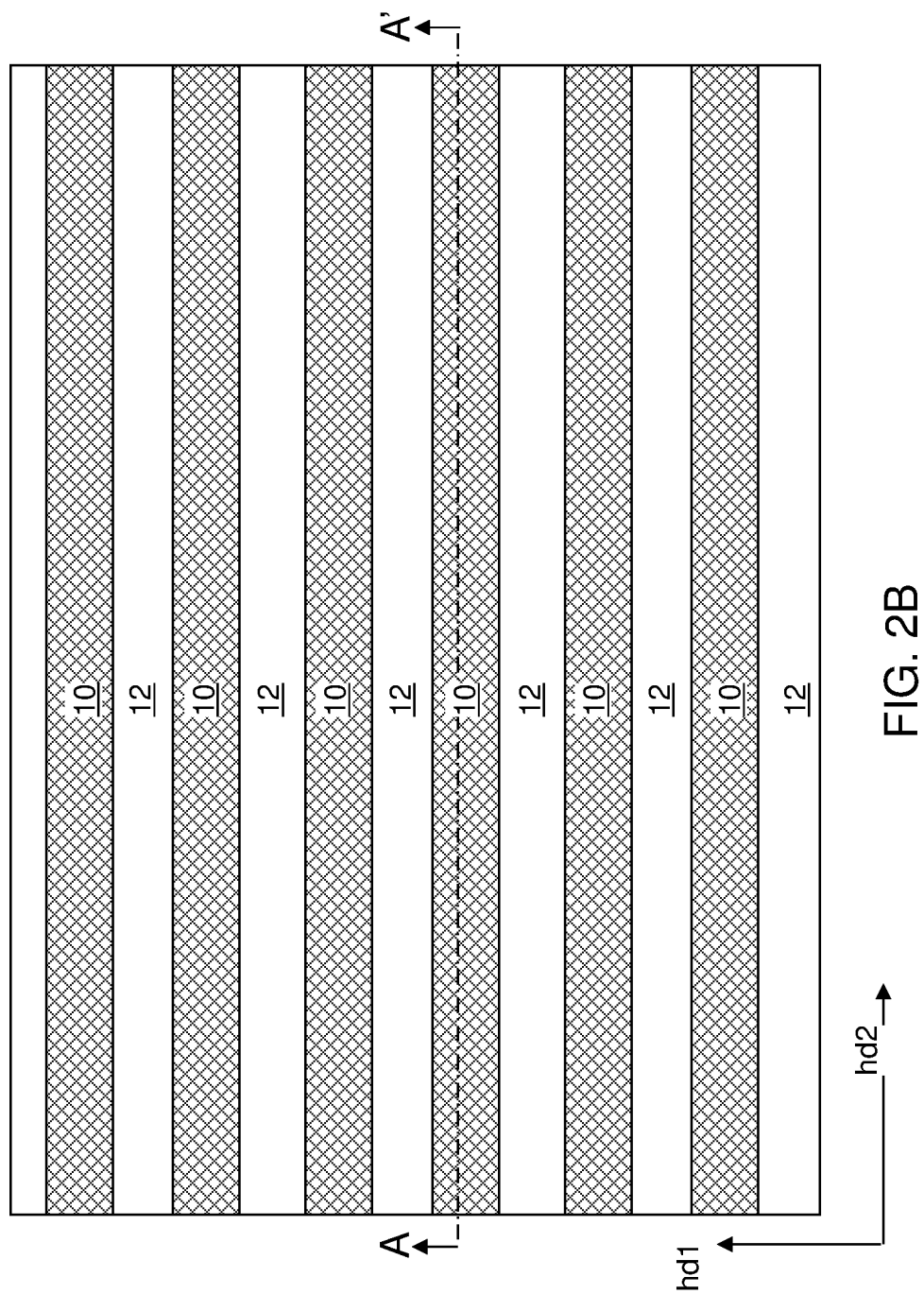
FIG. 2B is a horizontal cross-sectional view of the exemplary structure of FIG. 2A along the horizontal plane B-B' of FIG. 2A.
Figure 2C:
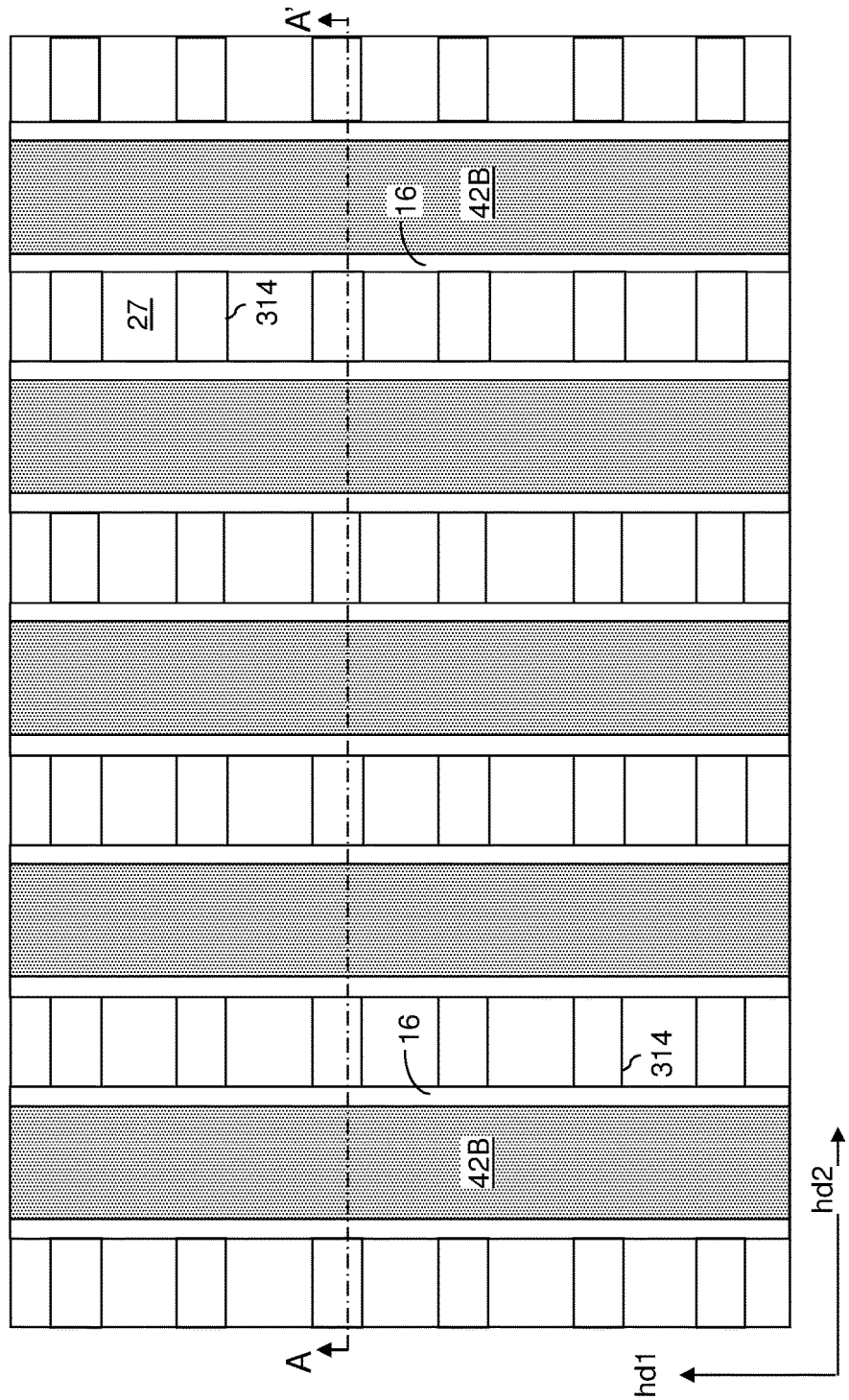
FIG. 2C is a see-through top-down view of the exemplary structure of FIG. 2A. The vertical plane A-A' is the plane of the cross-section for FIG. 2A.

Referring to FIGS. 2A-2C, an exemplary structure according to an embodiment of the present disclosure is illustrated, which can be an in-process ReRAM device. The exemplary structure includes a substrate 8, which includes an insulating layer at an upper portion thereof. In one embodiment, the substrate 8 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 8. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14B is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 can be patterned employing a combination of lithographic methods and an anisotropic etch such that each patterned portion of the semiconductor layer stack 14 is a rail structure that laterally extend along the first horizontal direction, and is laterally spaced apart among one another along the second horizontal direction by line trenches that extend along the first horizontal direction.

A spacer dielectric layer 40 can be formed at the bottom the line trenches by depositing a self-planarizing dielectric material (such as spin-on glass) or by filling the trenches with a dielectric material (such as organosilicate glass), planarizing the deposited dielectric material, and recessing the dielectric material selective to the rail structures including the materials of the semiconductor layer stack 14. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer. In one embodiment, each spacer dielectric liner 40 can include a first dielectric liner 40A such as a silicon nitride liner and a second dielectric liner 40B such as a silicon oxide liner.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the line trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the line trenches are filled with at least one dielectric material. Excess portions of the at least one dielectric material can be removed from above the horizontal plane including the top surfaces of the rail structures (including the materials of the semiconductor layer stack 14) by a planarization process, which can employ, for example, chemical mechanical planarization. Each remaining portion of the deposited dielectric material in the trenches constitutes a dielectric rail structure 42, which is also referred to as an access transistor level dielectric rail. In one embodiment, each dielectric rail structure 42 can include a dielectric rail liner 42A and a dielectric rail fill material portion 42B. Each dielectric rail structure 42 extends along the first horizontal direction hd1.

The rail structures that include the materials of the semiconductor layer stack 14 can be patterned to form a two-dimensional array of pillar cavities that extend to the top surfaces of the separator dielectric material portions 12. For example, a photoresist layer can be applied over the rail structures that include the materials of the semiconductor layer stack 14 and the dielectric rail structures 42, and can be lithographically patterned to form openings in areas overlying the separator dielectric material portions 12. A one-dimensional array of line patterns can be employed, in which each line pattern laterally extends along the second horizontal direction. An anisotropic etch that removes semiconductor materials of the semiconductor layer stack 14 selective to the material of the access transistor dielectric rails 42 can be performed employing the patterned photoresist layer as an etch mask to form the two-dimensional array of pillar cavities. After removal of the photoresist layer, the pillar cavities can be filled with a dielectric material to form dielectric pillar spacers 27, as shown in FIG. 2C.

Each patterned portion of the semiconductor layer stack 14 can be a semiconductor pillar structure (14B, 14C, 14T) including a vertical stack of a bottom active region 14B, a semiconductor channel 14C, and a top active region 14T. The dielectric pillar spacers 27 are located between each neighboring pair of semiconductor pillar structures (14B, 14C, 14T) that are laterally spaced apart along the first horizontal direction hd1. Each alternating sequence of dielectric pillar spacers 27 and semiconductor pillar structures (14B, 14C, 14T) that extend along the first horizontal direction hd1 forms a composite rail structure (14B, 14C, 14T, 27). The composite rail structures (14B, 14C, 14T, 27) are laterally spaced from one another along the second horizontal direction hd2.

Optionally, top surfaces of the top active regions 14T may be optionally vertically recessed, and a sacrificial material can be deposited to temporarily protect the semiconductor pillar structures (14B, 14C, 14T) during subsequent processing steps. The sacrificial material can be planarized so that the top surfaces of the remaining sacrificial material portions are coplanar with the top surfaces of the dielectric rail structures 42. The sacrificial material portions are herein referred to as sacrificial cap structures 314. If the sacrificial cap structures 314 are present, each composite rail structure (14B, 14C, 14T, 27, 314) includes a row of sacrificial cap structures 314.

Each composite rail structure (14B, 14C, 14T, 27, 314) includes remaining portions of the semiconductor layer stack 14 and the dielectric pillar spacers 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 8. In one embodiment, each dielectric rail structure 42 can include at least one dielectric material such as silicon nitride and/or silicon oxide. The dielectric rail structures 42 and the composite rail structures (14T, 14C, 14B, 27, 314) alternate along the second horizontal direction hd2.

Figure 3:
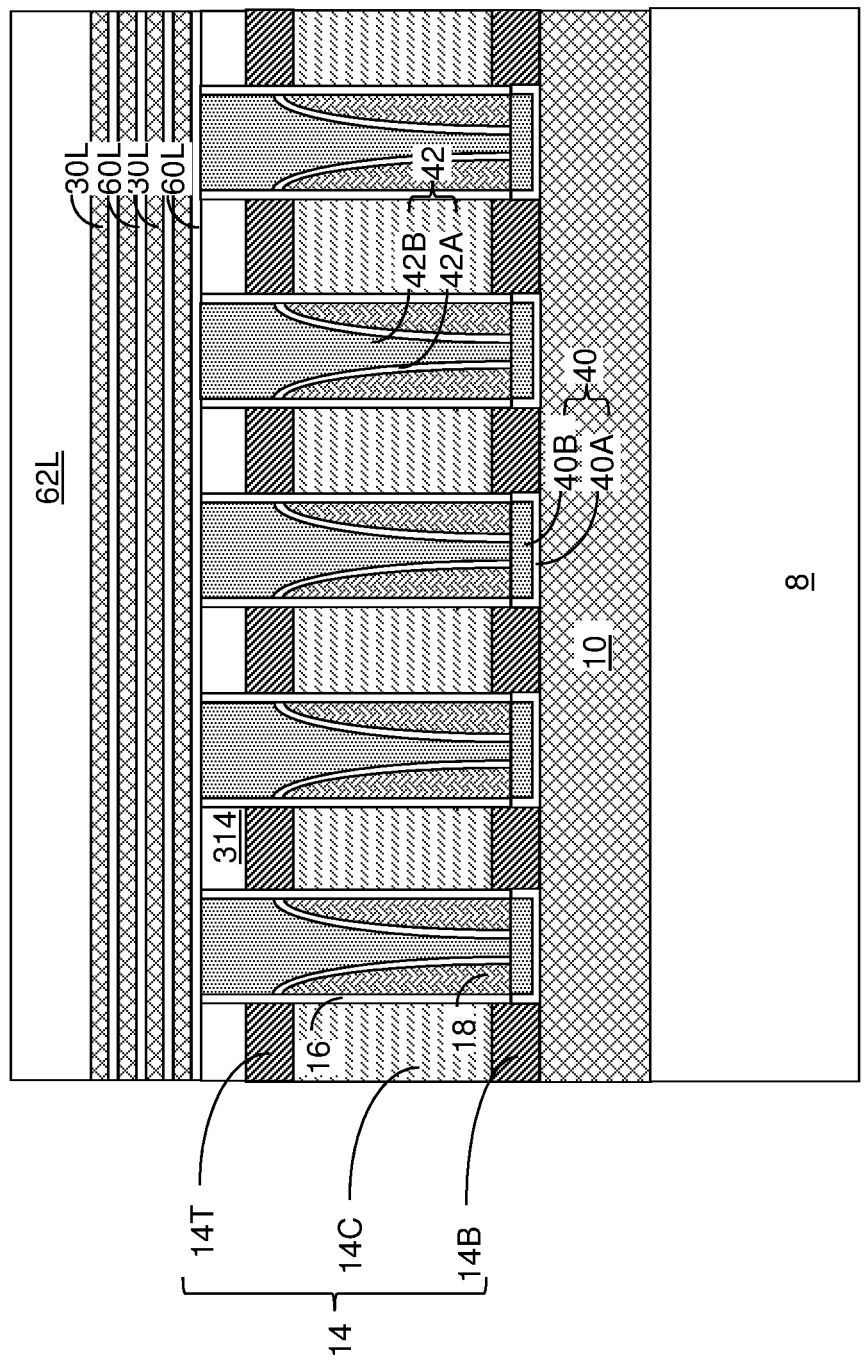
FIG. 3 is a vertical cross-sectional view of the exemplary structure after formation of alternating stacks of insulating layers and conductive material layers according to an embodiment of the present disclosure.

Referring to FIG. 3, an alternating stack of continuous electrically conductive layers 30L and continuous insulating layers 60L can be formed over the dielectric rail structures 42 and the composite rail structures (14T, 14C, 14B, 27, 314) as stacks of blanket (unpatterned) layers. A continuous insulating cap layer 62L can be formed over the alternating stack of the continuous electrically conductive layers 30L and the continuous insulating layers 60L. In an alternative embodiment, continuous sacrificial material layers may be formed in lieu of the continuous electrically conductive layers. In this case, remaining portions of continuous sacrificial material layers can be replaced with electrically conductive layers (which may have shapes of strips) after formation of bit lines. Such variations are expressly contemplated herein.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Figure 4A:
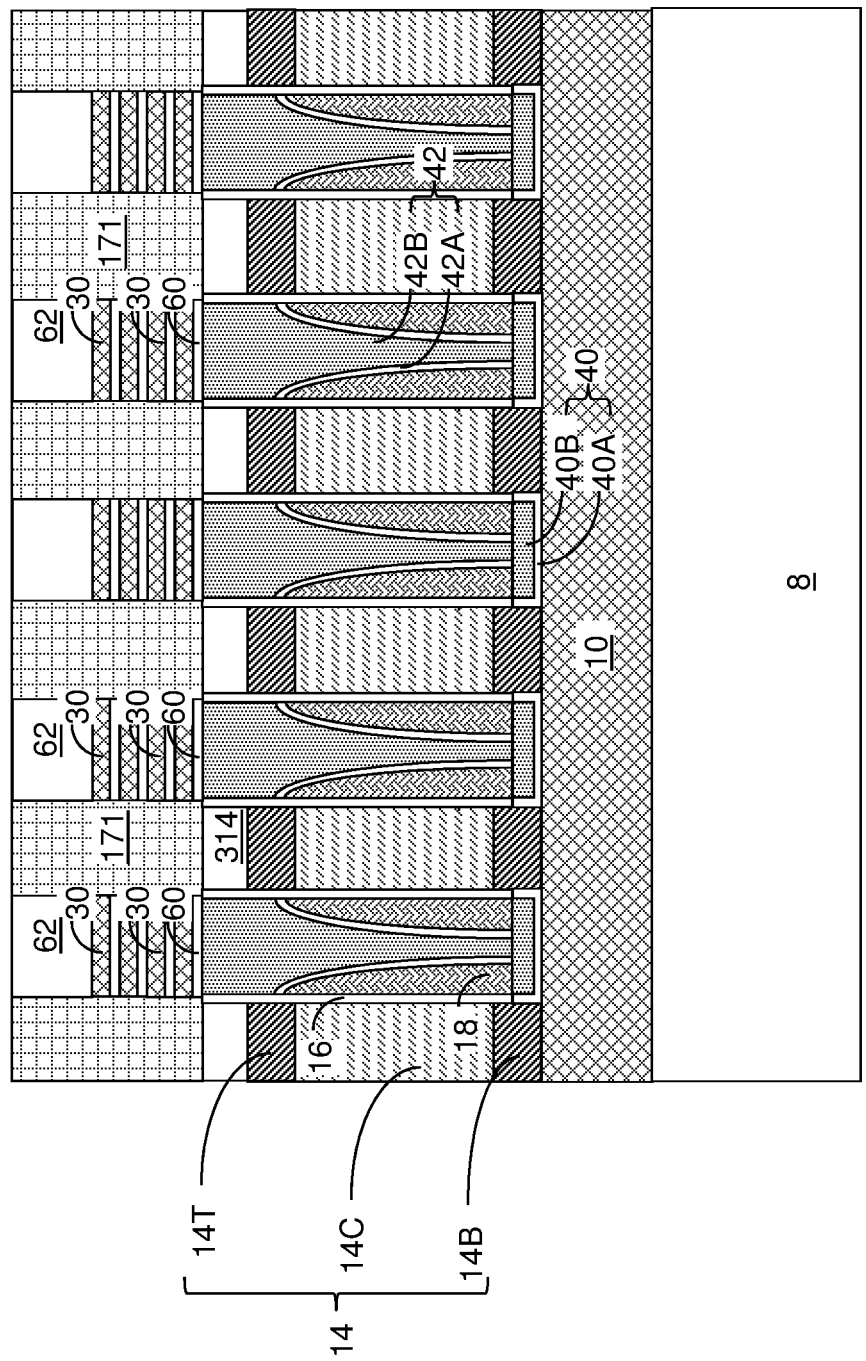
FIG. 4A is a vertical cross-sectional view of the exemplary structure after formation of sacrificial rail structures according to an embodiment of the present disclosure.

Referring to FIGS. 4A and 4B, the continuous insulating cap layer 62L and the alternating stack of the continuous electrically conductive layers 30L and the continuous insulating layers 60L can be patterned to form line stack rail structures. For example, a photoresist layer can be applied over the continuous insulating cap layer, and can be lithographically patterned to mask the areas of the dielectric rail structures 42 while not covering the areas of the composite rail structures (14T, 14C, 14B, 27, 314). In one embodiment, sidewalls of the patterned photoresist layer can be laterally offset from the boundaries between the dielectric rail structures 42 and the composite rail structures (14T, 14C, 14B, 27, 314) to ensure that the entire areas of the composite rail structures (14T, 14C, 14B, 27, 314) are not covered by the patterned photoresist layer.

An anisotropic etch can be performed through the continuous insulating cap layer 62L and the alternating stack of the continuous electrically conductive layers 30L and the continuous insulating layers 60L. Line trenches laterally extending along the first horizontal direction hd1 and laterally spaced apart along the second horizontal direction hd2 can be formed. The line trenches are herein referred to as memory level line trenches.

The line trenches divide the continuous insulating cap layer 62L and the alternating stack of the continuous electrically conductive layers 30L and the continuous insulating layers 60L into multiple rail structures that extend along the first horizontal direction hd1 and laterally spaced apart along the second horizontal direction hd2. The rail structures are herein referred to as line stack rail structures. Each line stack rail structure overlies a dielectric rail structure 42, extends along the first horizontal direction hd1, and is laterally spaced apart from one another along the second horizontal direction hd2.

Alternatively, the line trenches can laterally extend along the second horizontal direction hd2. In this case, structures that are subsequently formed can have a configuration that is rotated from the configuration described herein by 90 degrees along a vertical axis. Such variations are expressly contemplated herein.

Each patterned portion of the continuous insulating cap layer 62L is herein referred to as an insulating cap layer 62, which may be an insulating cap strip. Each patterned portion of the continuous electrically conductive layers is herein referred to as an electrically conductive layer 30 (which may function as word lines), which may be an electrically conductive strip. Each patterned portion of the continuous insulating layer is herein referred to as an insulating layer 60, which may be an insulating strip. As used herein, a "strip" refers to an elongated line, which may have a uniform width throughout or may have laterally protruding or laterally recessed regions. In one embodiment, each of the insulating cap layers 62, the electrically conductive layers 30, and the insulating layers 60 can have a respective uniform width that is invariant along the first horizontal direction hd1. Thus, each line stack rail structure (30, 60, 62) includes an alternating stack of electrically conductive layers 30 and insulating layers 60, and an insulating cap layer 62. In one embodiment, each line stack rail structure (30, 60, 62) can have a lesser width along the second horizontal direction hd2 than the underlying dielectric rail structure 42, and can be entirety within the area of the underlying dielectric rail structure 42.

In one embodiment, the electrically conductive layers 30 comprise a first electrically conductive material. In one embodiment, the first electrically conductive material can be a conductive metal nitride. In one embodiment, the first electrically conductive material can be selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1. Alternatively, conductive layers 30 may comprise a metal instead of or in addition to a metal nitride. In another embodiment, the first electrically conductive material can include a doped semiconductor material. The insulating layers 60 and the insulating cap layer 62 may comprise any suitable insulating material, such as silicon oxide.

The thickness of the electrically conductive layers 30 can be in a range from 6 nm to 60 nm, although lesser and greater thicknesses can also be employed. The thickness of the insulating lines 60 can be in a range from 6 nm to 60 nm, although lesser and greater thicknesses can also be employed. The thickness of the insulating cap layers 62 can be in a range from 6 nm to 300 nm, although lesser and greater thicknesses can also be employed.

A pair of an electrically conductive layer 30 and an insulating layer 60 can constitute a unit of repetition within each alternating stack (30, 60) of the electrically conductive layers 30 and the insulating layers 60. The total number of repetitions can be in a range from 8 to 1,024, although lesser and greater number of repetitions can also be employed. Thus, a plurality of alternating stacks (30, 60) of insulating layers 60 (which may be insulating strips) and electrically conductive layers 30 (which may be electrically conductive strips) is formed over a substrate 8. Each of the insulating layers 60 and the electrically conductive layers 30 extends along the first horizontal direction (i.e., the word line direction) hd1. The alternating stacks (30, 60) are laterally spaced from one another by the line trenches along the second horizontal direction hd2 (i.e., the global bit line direction).

A sacrificial material is deposited in the line trenches. The sacrificial material is a material that can be removed selective to the materials of the alternating stacks (30, 60), the insulating cap layers 62, the dielectric pillar spacers 27, and the sacrificial cap structures 314. For example, if the insulating layers 60, the insulating cap layers 62, and the dielectric pillar spacers 27 include silicon oxide, and if the sacrificial cap structures 314 include silicon nitride, the sacrificial material can include a semiconductor material such as amorphous silicon, amorphous carbon, diamond-like carbon, or a silicon-based polymer. Excess portions of the sacrificial material can be removed from above the horizontal plane including the top surfaces of the insulating cap layers 62 by a planarization process, which can employ a recess etch and/or chemical mechanical planarization. Each remaining portion of the sacrificial material in the line trenches 69 constitutes sacrificial rail structures 171.

Figure 5A:
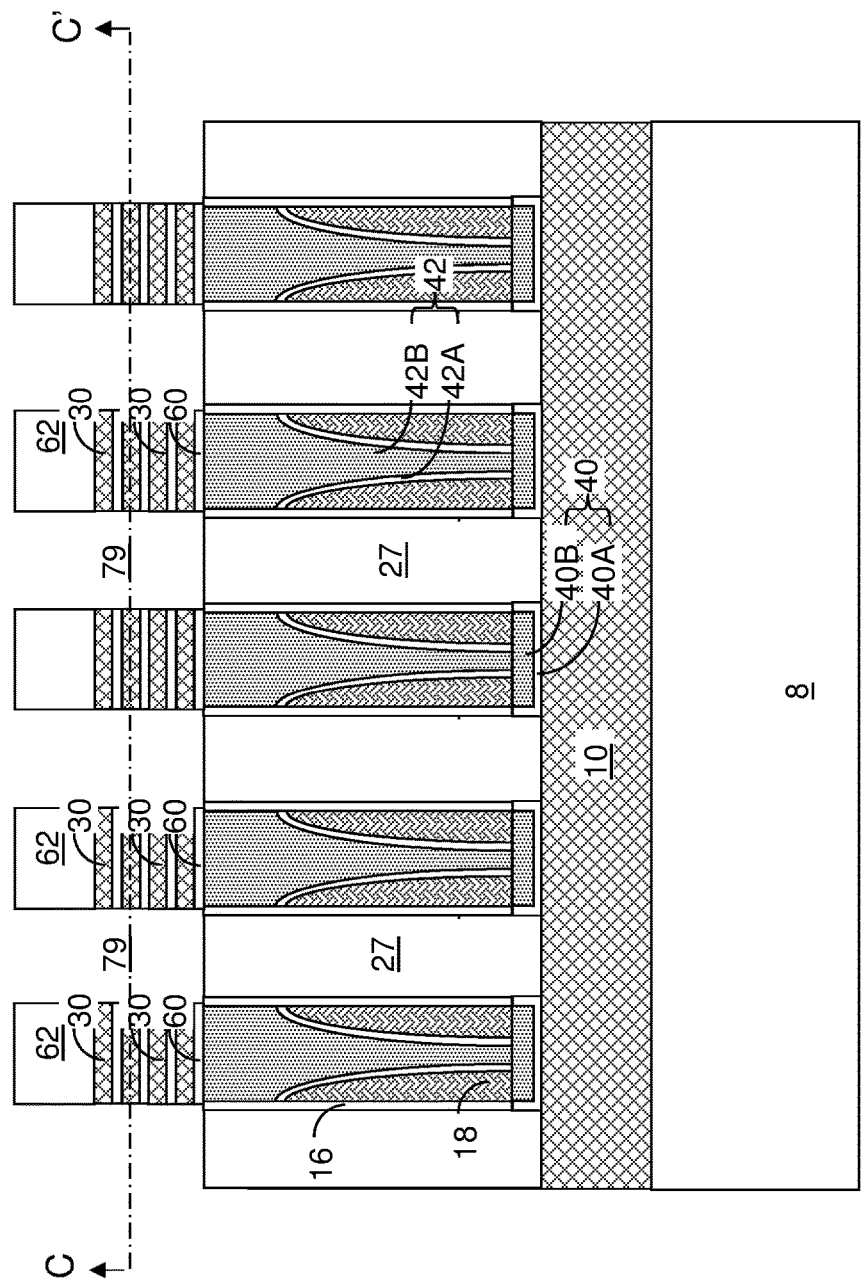
FIG. 5A is a vertical cross-sectional view of the exemplary structure after formation of isolation pillar cavities according to an embodiment of the present disclosure.
Figure 5C:
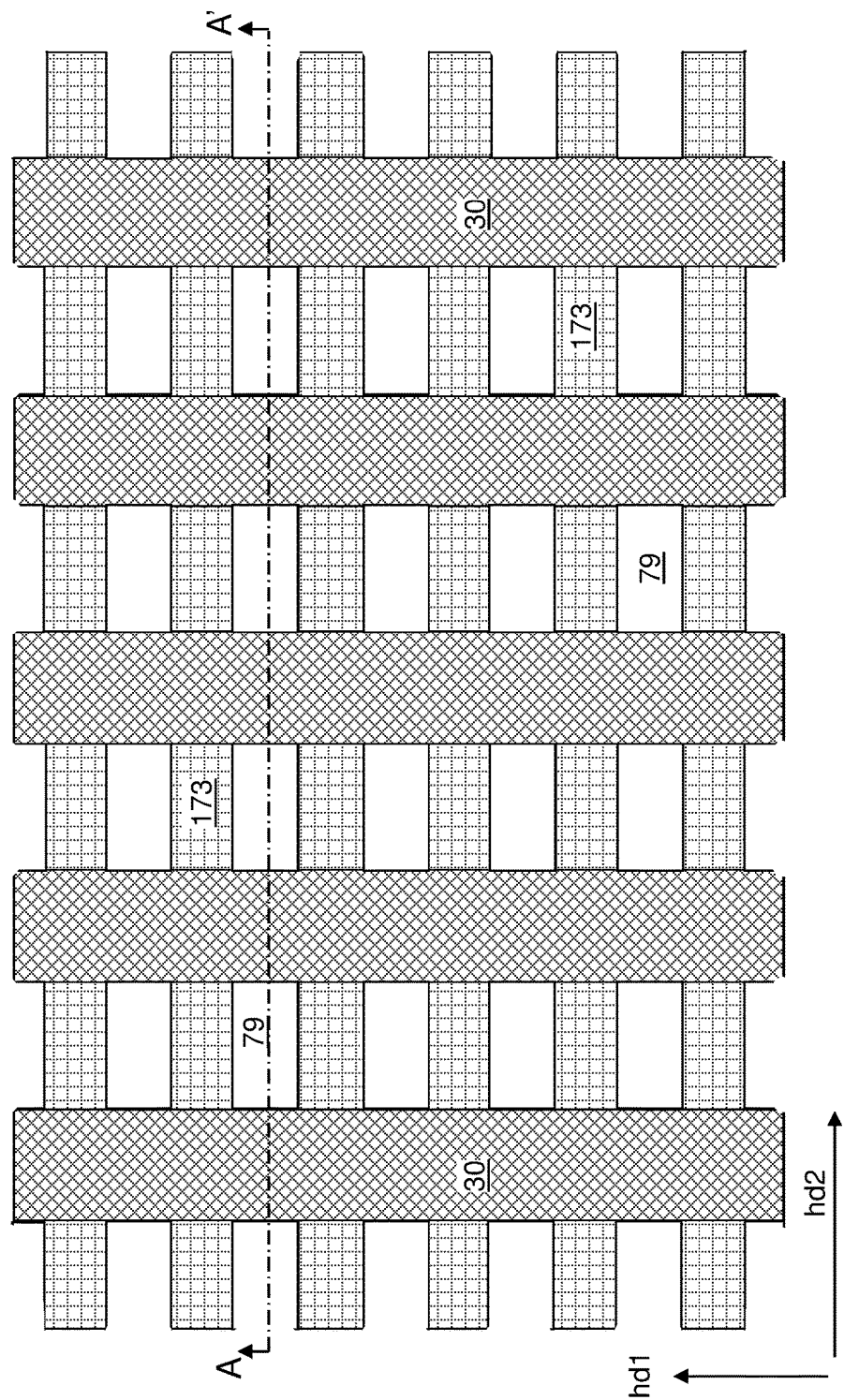
FIG. 5C is a horizontal cross-sectional view along the plane C-C' of the exemplary structure of FIG. 5A. The vertical plane A-A' is the plane of the cross-section for FIG. 5A.

Referring to FIGS. 5A-5C, a photoresist layer (not shown) can be applied over the insulating cap layers 62 and the sacrificial rail structures 171, and can be lithographically patterned to form a line and space pattern. Line trenches are formed between patterned portions of the photoresist layer such that the line trenches overlie the areas of the dielectric pillar spacers 27, while the patterned portions of the photoresist layer cover the areas of the global bit lines 10, which can include the areas of the semiconductor pillar structures (14B, 14C, 14T). Each patterned portion of the photoresist layer can overlie a respective global bit line 10, and a row of semiconductor pillar structures (14B, 14C, 14T) that are arranged along the second horizontal direction hd2.

An anisotropic etch process that etches the material of the sacrificial rail structures 171 selective to the material of the insulating cap layer 62 can be performed to remove unmasked portions of the sacrificial rail structures 171. Isolation pillar cavities 79 are formed in the volumes from which the material of the sacrificial rail structures 171 is removed by the anisotropic etch. The isolation pillar cavities 79 can have a respective rectangular horizontal cross-sectional shape. The remaining portions of the sacrificial rail structures 171 constitute sacrificial pillar structures 173, which can be arranged as a two-dimensional array. Each of the sacrificial pillar structures 173 can have a respective rectangular horizontal cross-sectional shape.

Figure 6A:
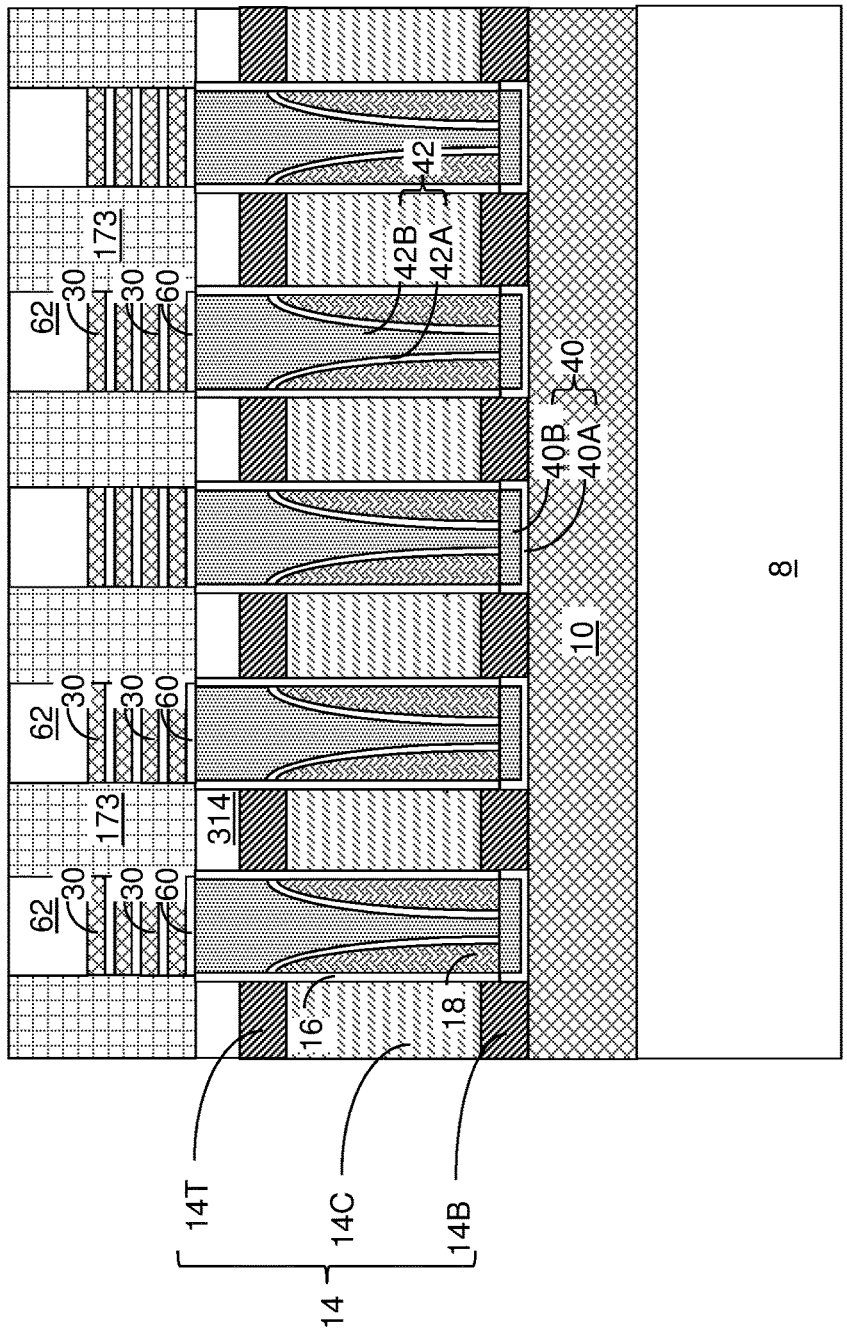
FIG. 6A is a vertical cross-sectional view of the exemplary structure after formation of dielectric pillar structures according to an embodiment of the present disclosure.
Figure 6B:
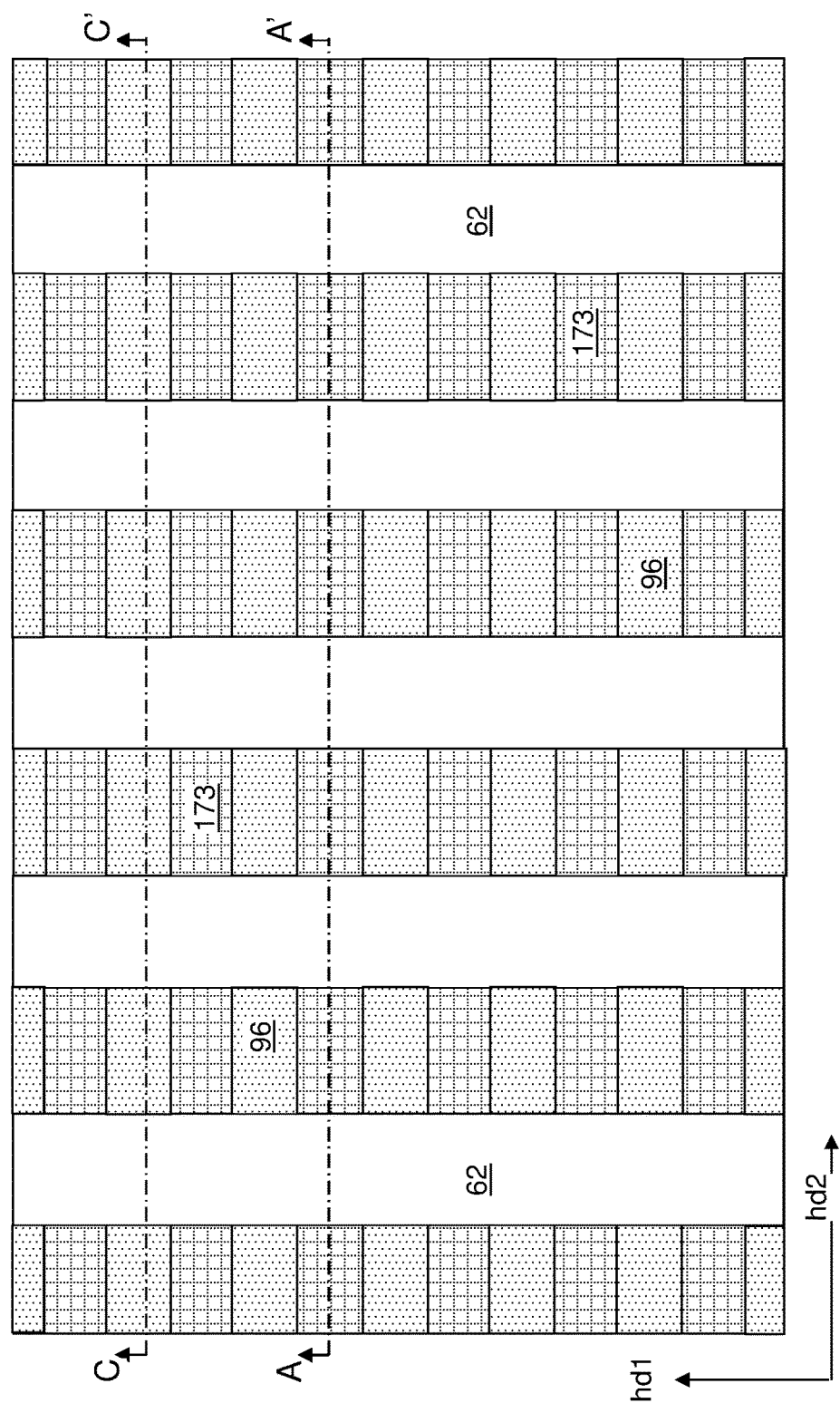
FIG. 6B is a top-down view of the exemplary structure of FIG. 6A. The vertical plane A-A' is the plane of the cross-section for FIG. 6A.
Figure 6C:
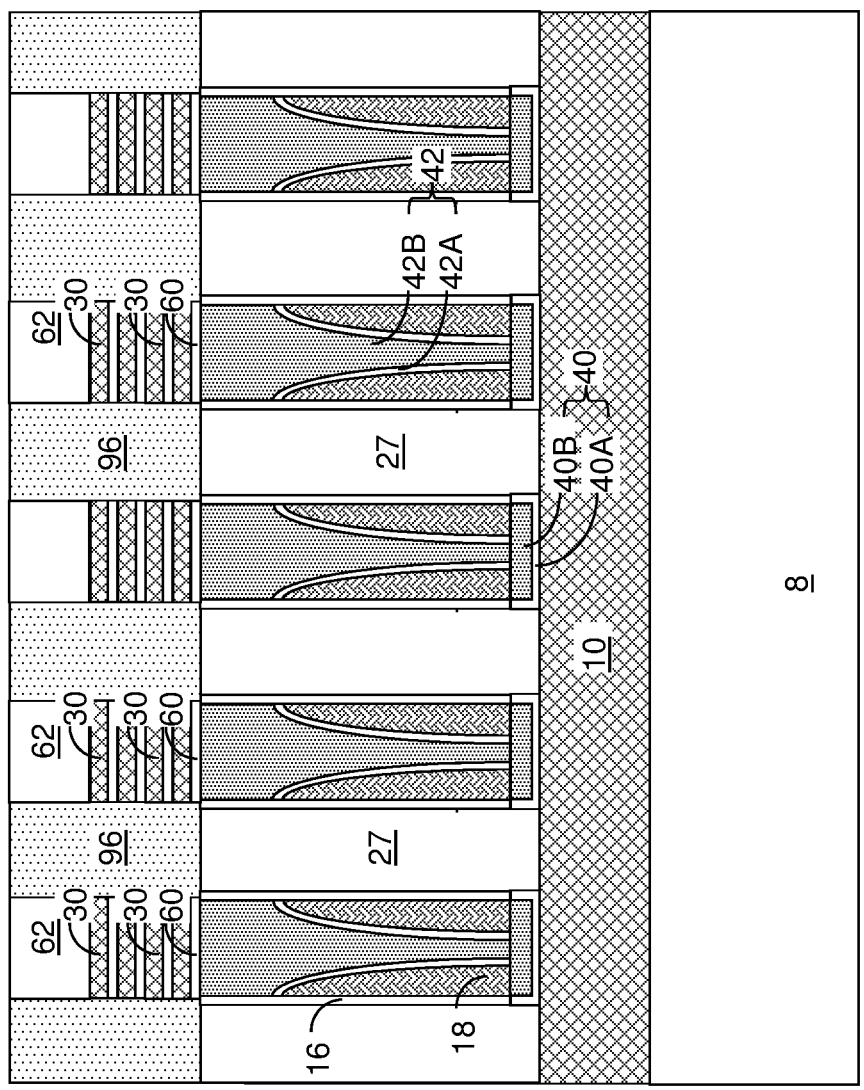
FIG. 6C is a vertical cross-sectional view of the exemplary structure along the plane C-C' of FIG. 6B.

Referring to FIGS. 6A-6C, a dielectric material such as silicon oxide is deposited in the isolation pillar cavities 79. The dielectric material can be deposited by a conformal deposition method or by spin-coating. Excess portions of the dielectric material can be removed from above the horizontal plane including the top surfaces of the insulating cap layers 62 by a planarization process, which can employ a recess etch and/or chemical mechanical planarization. Remaining portions of the dielectric material in the pillar cavities 79 constitute dielectric pillar structures 96, which can be arranged as a two-dimensional periodic array. The two-dimensional array of the sacrificial pillar structures 173 and the two-dimensional array of the dielectric pillar structures 96 can be laterally offset with respect to each other by about one half of the pitch of each two-dimensional array along the first horizontal direction hd1.

In one embodiment, each layer in an alternating stack (30, 60) of insulating layers 60 and electrically conductive layers 30 extends along the first horizontal direction hd1. The dielectric pillar structures 96 are formed on the sidewalls of the electrically conductive layers 30 and on the sidewalls of the insulating layers 60. A first row of dielectric pillar structures 96 arranged along the first horizontal direction hd1 can be located on first sidewalls of an alternating stack (30, 60), and a second row of dielectric pillar structures 96 arranged along the first horizontal direction hd1 can be located on second sidewalls of the alternating stack (30, 60). The first sidewalls and the second sidewalls can be laterally spaced from each other along the second horizontal direction hd2 by the width of the alternating stack (30, 60). The dielectric pillar structures 96 can be laterally separated among one another along the second horizontal direction hd2 by the width of the alternating stack (30, 60), and along the first horizontal direction hd1 by the width of an isolation pillar cavity 79 along the first horizontal direction hd1.

Figure 7A:
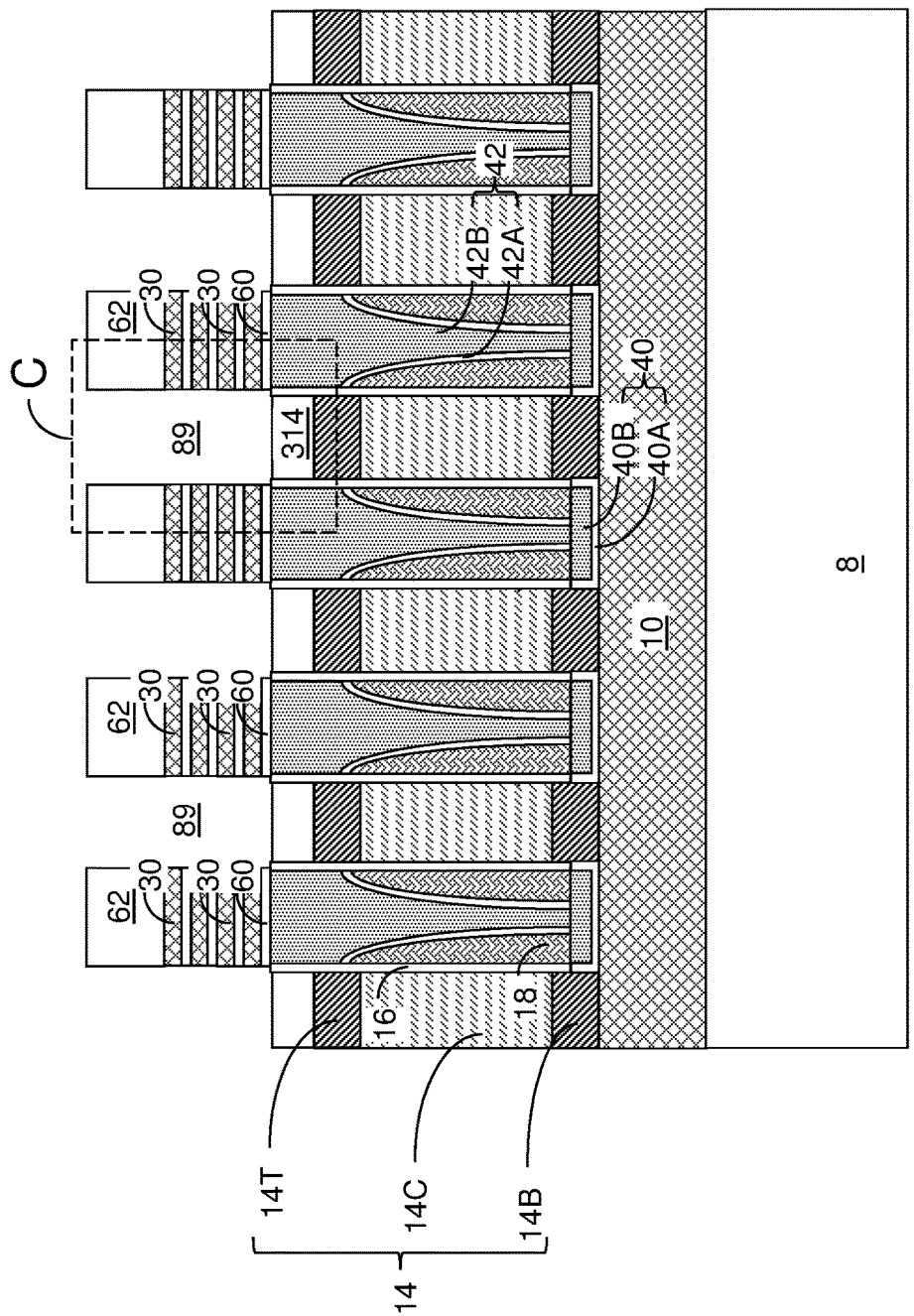
FIG. 7A is a vertical cross-sectional view of the exemplary structure after formation of bit line pillar cavities by removal of sacrificial pillar structures according to an embodiment of the present disclosure.
Figure 8:
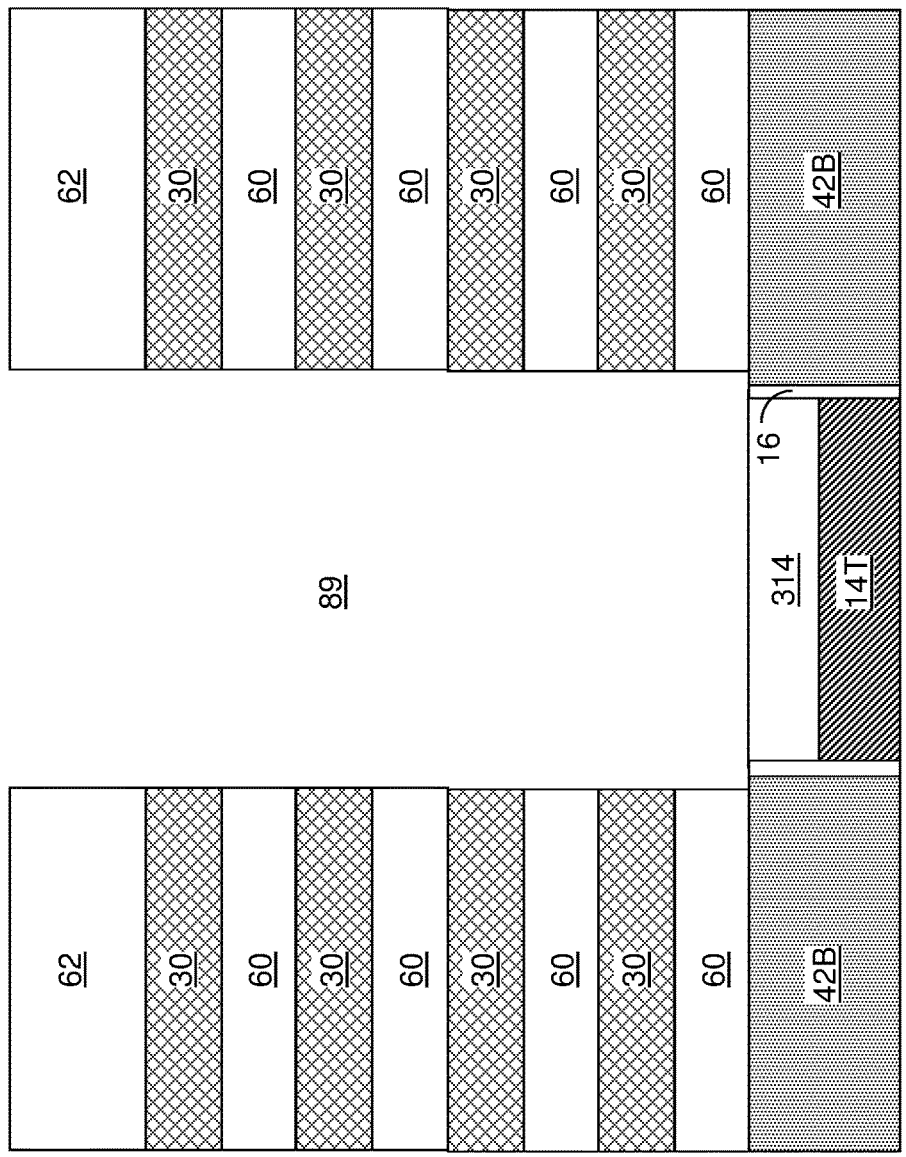
FIG. 8 is a vertical cross-sectional view of the exemplary structure along the plane C-C' of FIG. 7B.

Referring to FIGS. 7A, 7B, and 8, the material of the two-dimensional array of the sacrificial pillar structures 173 can be removed selective to the materials of the two-dimensional array of the dielectric pillar structures 96, the insulating cap layers 62, and the alternating stacks (30, 60). In an illustrative example, if the sacrificial material of the two-dimensional array of the sacrificial pillar structures 173 includes amorphous silicon, a wet etch employing a trimethyl-2 hydroxyethyl ammonium hydroxide (TMY) solution or a KOH solution may be employed to remove the two-dimensional array of the sacrificial pillar structures 173. A two-dimensional array of memory openings 89 can be formed in the volumes from which the sacrificial pillar structures 173 are removed. Each memory opening 89 can have a substantially rectangular horizontal cross-sectional shape.

It is understood that the processes employed in FIGS. 2A-8 to form the alternating stack of electrically conductive layers 30 (which can be the word lines of a ReRAM device) and insulating layers 60 and the select transistors (14, 16, 18) may be modified as needed to provide the structure illustrated in FIGS. 7A, 7B, and 8. For example, the select transistors (14, 16, 18) may be formed by any suitable method followed by forming the alternating stack (60, 30) over the substrate 8. The alternating stack (60, 30) is then photolithographically patterned and etched (e.g., reactively ion etched) to form the memory openings 89 through the alternating stack (60, 30) to arrive at the structure shown in FIGS. 2A-8. Further, sacrificial material layers may be provided in lieu of the electrically conductive layers 30. In this case, the sacrificial material layers can be replaced with electrically conductive layers in subsequent processing steps such as after formation of vertical bit lines.

Referring to FIG. 9, sidewalls of the electrically conductive layers 30 can be laterally recessed from the periphery of each memory opening 89 by an isotropic etch that etches the material of the electrically conductive layers 30 selective to the materials of the insulating layers 60, the insulating cap layers 62, the dielectric pillar structures 96, the dielectric rail fill material portions 42B (of the dielectric rail structures 42), and the sacrificial cap structures 314 located over the top active regions 14T. For example, a wet etch process that etches the conductive material (which can be a metallic material) of the electrically conductive layers selective to the dielectric materials of the materials of the insulating layers 60, the insulating cap layers 62, the dielectric pillar structures 96, and the dielectric rail fill material portions 42B and the sacrificial cap structures 314 located over the top active regions 14T can be employed.

The sidewalls of the electrically conductive layers 30 are laterally recessed relative to the sidewalls of the insulating layers 60 around each memory opening 89. The duration of the isotropic etch process can be selected such that the lateral extent LE of each laterally recessed region 89R can be in a range from 30% to 600%, such as from 75% to 300%, of the thickness of the electrically conductive layers 30. For example, the lateral extent LE of each laterally recessed region 89R can be in a range from 4 nm to 100 nm, such as from 6 nm to 40 nm. Each laterally recessed region 89R can be laterally bounded by a planar vertical sidewall 30P of an electrically conductive layer 30 that laterally extends, for example, along the first horizontal direction hd1, and a pair of concave vertical sidewalls 30C of the electrically conductive layer 30, as shown in FIG. 9B. The planar vertical sidewall and the pair of concave vertical sidewalls of the electrically conductive layer 30 can vertically extend from an underlying one of the insulating layers 60 to an overlying one of the insulating layers 60. Each concave vertical sidewall of the laterally recessed region 89R can be adjoined to a respective vertical sidewall of the dielectric pillar structures 96. Thus, the laterally recessed regions 89 are bounded in lateral extent by concave sidewalls 30C of the electrically conductive layers 30 that adjoin a respective pair of dielectric pillar structures 96.

Figure 10:
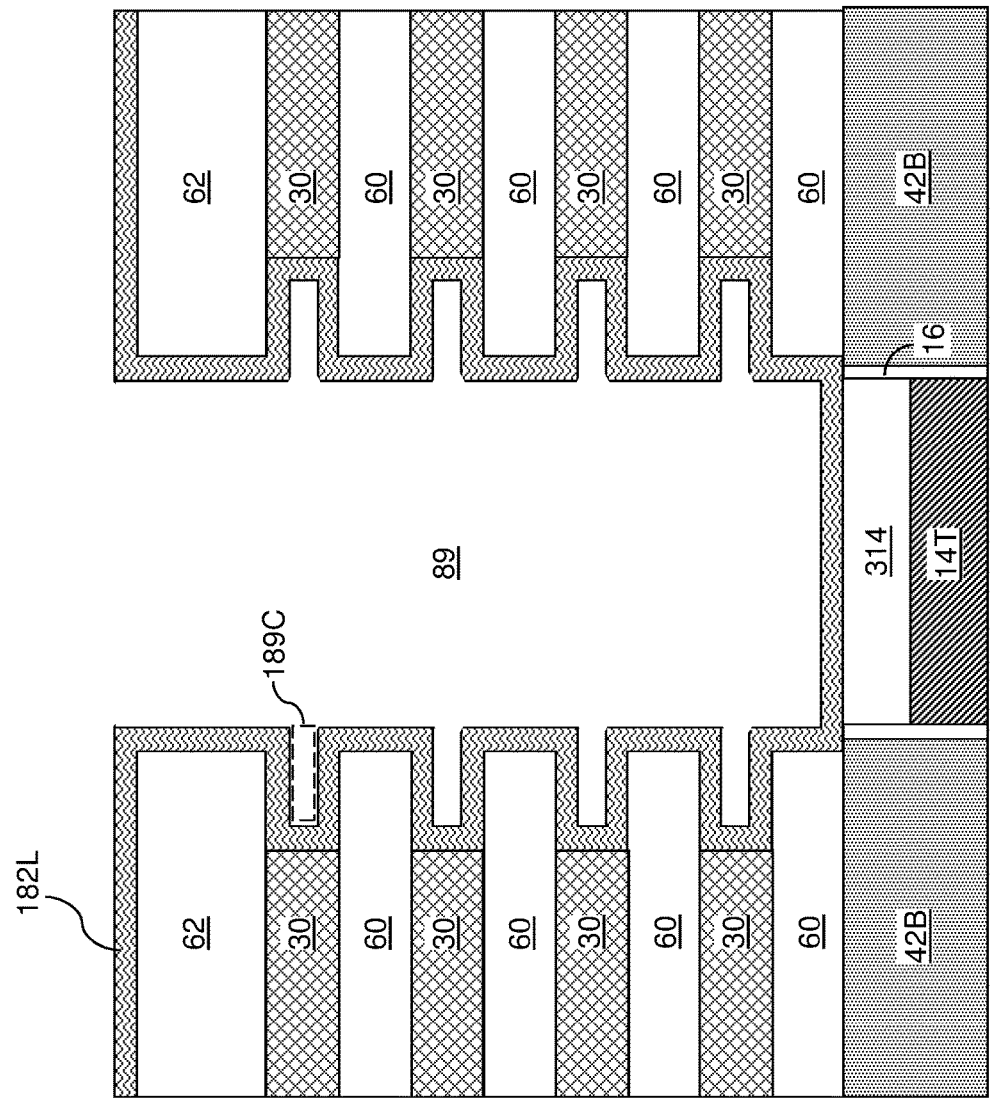
FIG. 10 is a vertical cross-sectional view of the exemplary structure after deposition of a barrier material layer according to an embodiment of the present disclosure.

Referring to FIG. 10, a barrier material layer 182L can be conformally deposited within the volumes of each laterally recessed region 89R. The barrier material layer 182L can be deposited on the physically exposed sidewalls of the insulating layers 60, the electrically conductive layers, 30, and the insulating cap layers 62, on physically exposed portions of the top surfaces and the bottom surfaces of the insulating layers 60 and the insulating cap layers 62, and the sacrificial cap structures 314 located over the top surfaces of the top active regions 14T by a conformal deposition process. As used herein, a "barrier material" is an insulating material or a semiconductor material that is provided with a suitable thickness to provide an energy barrier for conduction of electrical current therethrough. Generally, a barrier material composed of an insulating material has a small thickness (which may be, for example, in a range from 1 nm to 2 nm) in order to provide sufficient tunneling current under an electrical bias thereacross, and a barrier material composed of a semiconductor material has a greater thickness (which may be in a range from 2 nm to 20 nm depending on the conductivity that can be modulated by doping with electrical dopants) in order to limit the electrical current therethrough under an electrical bias thereacross.

In one embodiment, the thickness of the barrier material layer 182L is selected such that the barrier material layer 182L does not completely fill each laterally recessed region 89R, and a lateral cavity 189C remains in each laterally recessed region 89R. The height of each lateral cavity 189C can be in a range from 2 nm to 30 nm, such as from 4 nm to 20 nm and/or from 6 nm to 15 nm, although lesser and greater heights can also be employed.

In one embodiment, the barrier material layer 182L comprises a material selected from amorphous carbon, diamond-like carbon (DLC), an amorphous semiconductor material, and a polycrystalline semiconductor material. In one embodiment, the barrier material layer 182L comprises, and/or consists essentially of, silicon or a silicon-containing compound. In one embodiment, the conformal barrier material layer 182L can include undoped amorphous silicon or doped amorphous silicon having electrical conductivity less than $1.0 \times 10^{-3}$ S/cm, although greater electrical conductivity may be employed provided that the thickness of the conformal barrier material layer 182L increases correspondingly.

Figure 11:
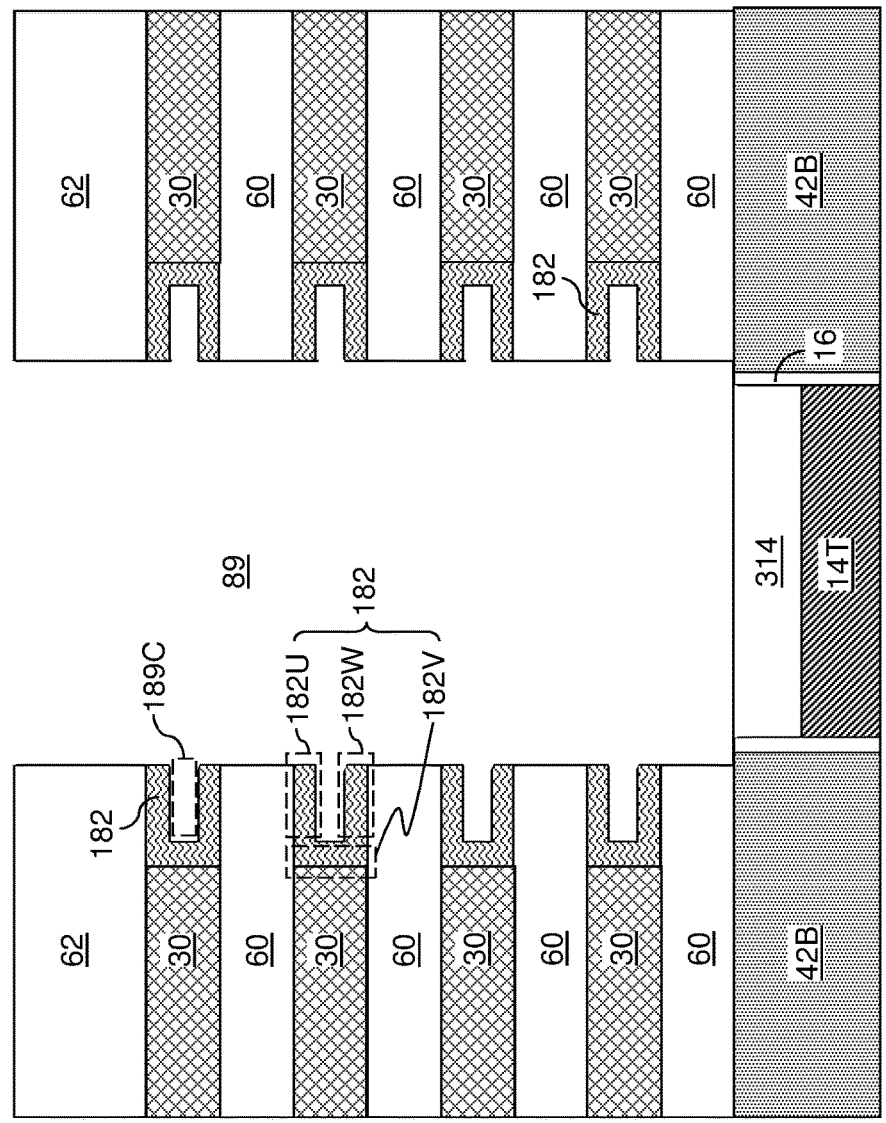
FIG. 11 is a vertical cross-sectional view of the exemplary structure after formation of discrete clam-shaped barrier material portions according to an embodiment of the present disclosure.

Referring to FIG. 11, discrete clam-shaped barrier material portions 182 can be formed within the laterally recessed regions 89R. For example, portions of the barrier material layer 182L that are located outside the laterally recessed regions 89R can be anisotropically etched by an anisotropic etch process. The anisotropic etch process may be selective to the material of the insulating cap layers 62. The sacrificial cap structures 314 located over may, or may not, be collaterally recessed by the anisotropic etch process. The remaining portions of the barrier material layer 182L in the laterally recessed regions 89R constitute the discrete clam-shaped barrier material portions 182. In one embodiment, the barrier material portions 182 can function as a non-linear element of the respective memory cells.

A laterally-extending cavity 189C is present within each of the laterally recessed regions 89R after formation of the discrete clam-shaped barrier material portions 182. Each of the discrete clam-shaped barrier material portions 182 can include an upper horizontally-extending portion 182U overlying the laterally-extending cavity 189C, a lower horizontally-extending portion 182W underlying the laterally-extending cavity 189C, and a vertically-extending portion 182V connecting the upper and lower horizontally-extending portions (182U, 182W). In one embodiment, sidewalls of the upper horizontally-extending portion 182U and the lower horizontally-extending portion 182W of each clam-shaped barrier material portion 182 can be vertically coincident with a set of sidewalls of the insulating layers 60 within the alternating stack (30, 60) embedding the clam-shaped barrier material portion 182. As used herein, a first sidewall and a second sidewall are "vertically coincident" with each other if the second sidewall overlies or underlies the first sidewall and if there exists a vertical plane that includes the first sidewall and the second sidewall.

Figure 12A:
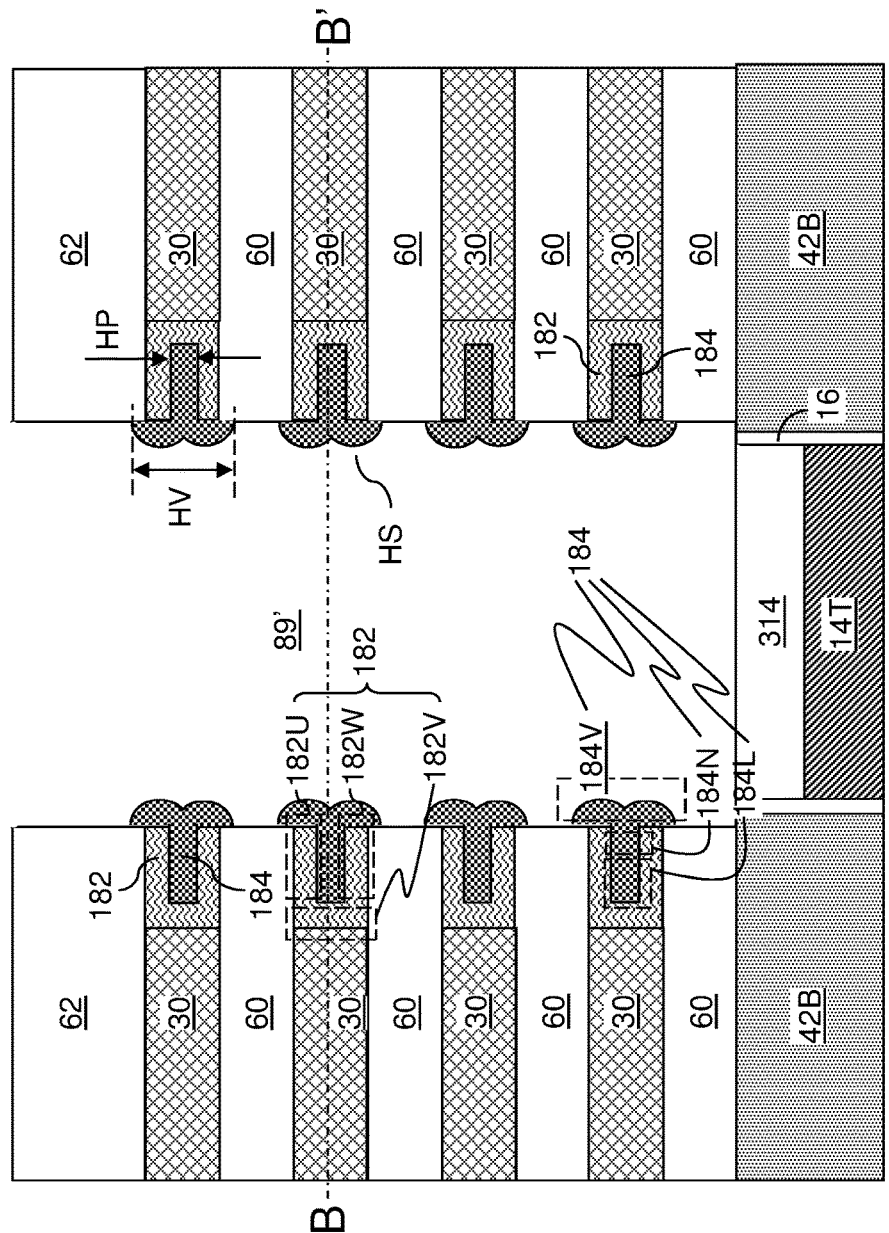
FIG. 12A is a vertical cross-sectional view of the exemplary structure after formation of rivet-shaped middle electrodes according to an embodiment of the present disclosure.
Figure 12B:
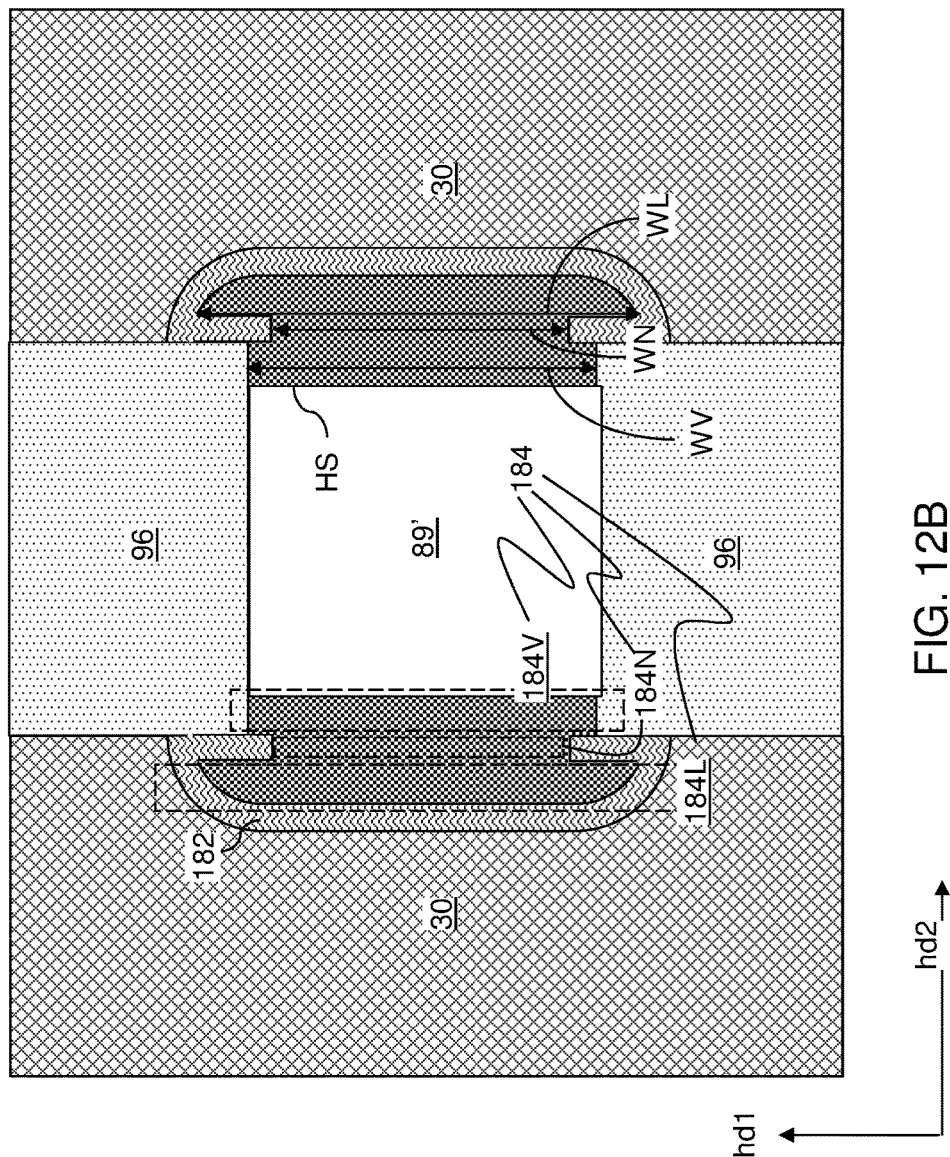
FIG. 12B is a horizontal cross-sectional view of the exemplary structure along the plane B-B' of FIG. 12A.

Referring to FIGS. 12A and 12B, a metallic material can be selectively deposited employing a selective deposition process, in which the metallic material grows from surfaces of the discrete clam-shaped barrier material portions 182 and does not grow from surfaces of the insulating layers 60, the insulating cap layers 62, and the sacrificial cap structures 314. In one embodiment, the selective deposition of the metallic material can be performed by a chemical vapor deposition process or an atomic layer deposition process in which the material of the discrete clam-shaped barrier material portions 182 reacts with a precursor gas of the selective deposition process to form a nucleation material layer containing the metallic material. Upon formation of the nucleation material layer, subsequent deposition of the metallic material after formation of the nucleation material layer proceeds only from surfaces of the nucleation material layer and does not proceed from surfaces of the insulating layers 60, the insulating cap layers 62, and the sacrificial cap structures 314.

In one embodiment, the discrete clam-shaped barrier material portions 182 can comprise, and/or can consist essentially of, silicon or a silicon-containing compound (such as a silicon-germanium alloy, a silicon-carbon alloy, or a silicon-germanium carbon alloy), and the chemical vapor deposition process or the atomic layer deposition process that forms the nucleation material layer can employ a fluorine-containing precursor gas or a hydrogen-containing precursor gas that combines with silicon atoms to deposit the nucleation material layer with release of a fluorine-containing gas or a hydrogen-containing gas. In one embodiment, a chemical reaction can be employed in which silicon atoms are consumed, but are not incorporated into the deposited metallic material, and the deposited metallic material can consist essentially of metal atoms. The reacted silicon atoms can combine with fluorine atoms or hydrogen atoms provided from the fluorine-containing precursor gas or the hydrogen-containing precursor gas to form volatile silicon hydrides or silicon fluorides.

In an illustrative example, the chemical vapor deposition process or the atomic layer deposition process can employ a tungsten precursor gas such as tungsten hexafluoride as a reactant. If tungsten hexafluoride is employed as the tungsten precursor gas, the following reaction can selectively deposit a tungsten middle electrode from tungsten hexafluoride: $2WF_6+3Si \rightarrow 2W+3SiF_4$.

In another embodiment, a chemical reaction can be employed in which silicon atoms are not consumed but are employed as catalysts. The silicon atoms are not incorporated into the deposited metallic material, and the deposited metallic material can consist essentially of metal atoms.

In an illustrative example, the chemical vapor deposition process or the atomic layer deposition process can employ an aluminum precursor gas such as dimethylalumimum hydride as a reactant. If dimethylalumimum hydride is employed as the aluminum precursor gas, the follow reaction can selectively deposit an aluminum middle electrode from dimethylalumimum hydride precursor: $2Al(CH_3)_2H+H_2 \rightarrow 2Al+2CH_4$.

The duration of the selective deposition process can be controlled such that the deposited metallic material is formed as discrete material portions, each contacting a respective one of the discrete clam-shaped barrier material portions 182. Each deposited metallic material portion can function as a middle electrode 184 disposed between a clam-shaped barrier material portion 182 and a resistive memory element to be subsequently formed. Further, each deposited metallic material portion includes a first portion located within a memory opening 89 as formed at the processing steps of FIG. 8, and second portion located outside the memory opening 89. The first portion has a greater vertical extent than the second portion, and is herein referred to as a head portion or a vertically-extending portion 184V. The second portion has the same vertical extent as a laterally recessed region 89R, and is herein referred to as a protrusion portion (184N, 184L). The combination of the shape of the head portion and the shape of the protrusion portion can be similar to a rivet, and thus, in one embodiment each discrete metallic material portion deposited by the selective deposition process is herein referred to as a rivet-shaped middle electrode 184. In alternative embodiments, the middle electrode 184 does not have a rivet-shape and instead has a nail-shape or "T-shape" having a wider vertically-extending portion (i.e., head portion) 184V and a narrower laterally-extending portion (i.e., step portion) 184L connected directly to the vertically-extending portion 184V.

Each rivet-shaped middle electrode 184 is formed on a discrete clam shaped barrier material portion 182. Each of the rivet-shaped middle electrodes 184 includes a protrusion portion (184N, 184L) located inside a respective one of the laterally recessed regions 89R and embedded within a respective one of the discrete clam shaped barrier material portions 182, and further includes a vertically-extending portion 184V located in the memory opening 89 outside the laterally recessed regions 89R and having a greater vertical extent than the embedded portion, i.e., the protrusion portion (184N, 184L).

The vertically-extending portion 184V of each of the rivet-shaped middle electrodes 184 can be formed with at least one convex sidewall that faces the remaining volume of a memory opening 89, as shown in FIG. 12A. The at least one convex sidewall can be a pair of convex sidewalls. As illustrated in the cross-sectional view of FIG. 12B, the protrusion portion (184N, 184L) of each of the rivet-shaped middle electrodes 184 can be laterally spaced from a pair of dielectric pillar structures 96 by a respective one of the discrete clam-shaped barrier material portions 182. The vertically-extending portion 182V of each of the rivet-shaped middle electrodes 184 can contact sidewalls of the pair of dielectric pillar structures 96.

In one embodiment shown in FIG. 12A, the protrusion portion (184N, 184L) of each of the rivet-shaped middle electrodes 184 can have a vertical thickness HP that is the same as a vertical separation distance between the upper and lower horizontally-extending portions (182U, 182W) of a discrete clam-shaped barrier material portion 182. The vertically-extending portion 184V is connected to the protrusion portion (184N, 184L), and has a vertical extent HV that is greater than the vertical thickness HP (i.e., greater than a vertical separation distance between a top surface of the upper horizontally-extending portion 182U and a bottom surface of the lower horizontally-extending portion 182W).

In one embodiment, the protrusion portion (184N, 184L) of each of the rivet-shaped middle electrodes 184 includes: a laterally-extending portion 184L having a pair of vertical convex sidewalls and having a maximum lateral width WL that is the same as the maximum lateral width WL of the protrusion portion (184N, 184L); and a neck portion 184N having a lesser maximum lateral width WN than the laterally-extending portion 184L and connecting the laterally-extending portion 184L to a respective vertically-extending portion 184V. The maximum lateral width WL of the protrusion portion (184N, 184L) can be greater than the maximum lateral width WV of the vertically-protruding portion 184V for each of the rivet-shaped middle electrodes 184 as illustrated in FIG. 12B. In other words, WV>WN and WL>WV>WN.

In one embodiment, the vertically-extending portion 184V of each of the rivet-shaped middle electrodes 184 has a head-side sidewall HS that includes a pair of convex surfaces that are adjoined to each other. In one embodiment, the rivet-shaped middle electrodes 184 consist essentially of an elemental metal selected from tungsten or aluminum. Each unfilled volume of a memory opening 89 is a cavity 89'.

Figure 13:
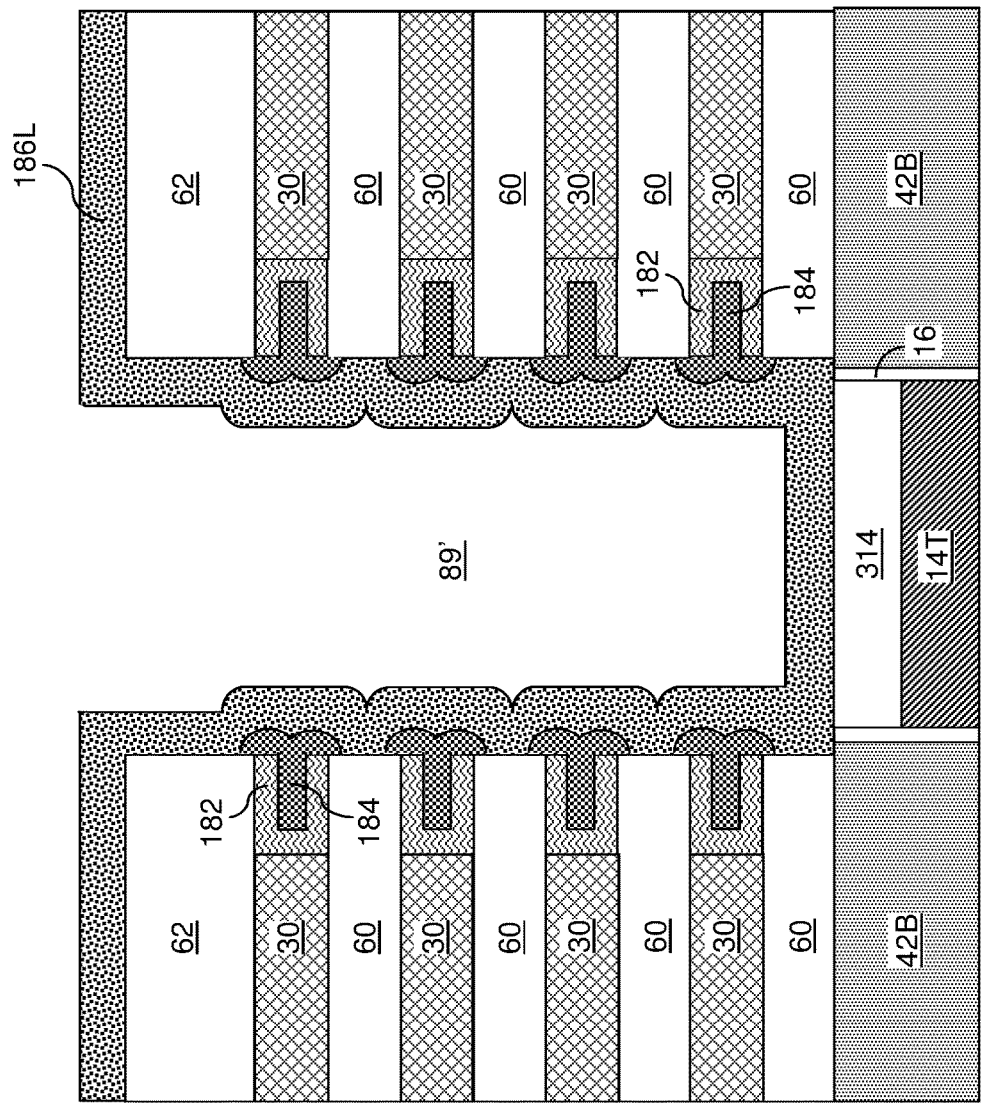
FIG. 13 is a vertical cross-sectional view of the exemplary structure after deposition of a continuous memory element material layer according to an embodiment of the present disclosure.

Referring to FIG. 13, a continuous memory element material layer 186L is deposited employing a conformal deposition process (such as low pressure chemical vapor deposition or atomic layer deposition). The continuous memory element material layer 186L is deposited on the rivet-shaped middle electrodes 184, physically exposed portions of the sidewalls of the insulating layers 60 and the insulating cap layers 62, and on the top surfaces of the insulating cap layers 62 and the sacrificial cap structures 314. The continuous memory element material layer 186L includes a material that can be employed to form resistive memory elements. The continuous memory material layer 186L can include a transition metal oxide or another suitable resistivity switching material. For example, the memory material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

Each BMC can include a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$. The memory cell may also include a barrier material, such as amorphous silicon or other suitable barrier materials. An interfacial barrier oxide is located between the metal oxide material and the barrier material. For an amorphous silicon barrier material, the interfacial barrier oxide may comprise silicon oxide. Without wishing to be bound by a particular theory, it is believed that the BMC ReRAM device operates as follows. The switching mechanism in BMC stack is generally understood as oxygen interstitial (Oi) generation in the interfacial barrier oxide (e.g., $SiO_2$) at the amorphous silicon (a-Si)/$TiO_{2-\delta}$ interface after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface. This re-oxidation decreases the conductivity of the $TiO_{2-\delta}$ material and/or increases the thickness of the insulating interfacial barrier oxide and hence increases the resistance of the BMC memory cell. During the SET operation, opposite voltage is applied across the cell, and Ti—O bonds are supposed to be broken down to generate Oi and Vo (oxygen vacancy) pair in the titanium oxide layer. Oi may drift back to the a-Si/$TiO_{2-\delta}$ interface along the electric field to increase the conductivity of the $TiO_{2-\delta}$ layer and/or decrease the thickness of the insulating interfacial barrier oxide and hence decrease the resistance of the BMC memory cell to set the memory cell into the low resistivity state, LRS.

Without wishing to be bound by a particular theory, it is believed that a BMC ReRAM device may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide.

The inner sidewalls of the continuous memory element material layer 186L that face a respective cavity 89' within the memory opening 89 can have a vertically undulating profile. In other words, the inner sidewalls of the continuous memory element material layer 186L can have a variable lateral distance from the sidewalls of the insulating layers 60 that vary as a function of a vertical distance from the substrate 8.

Figure 14A:
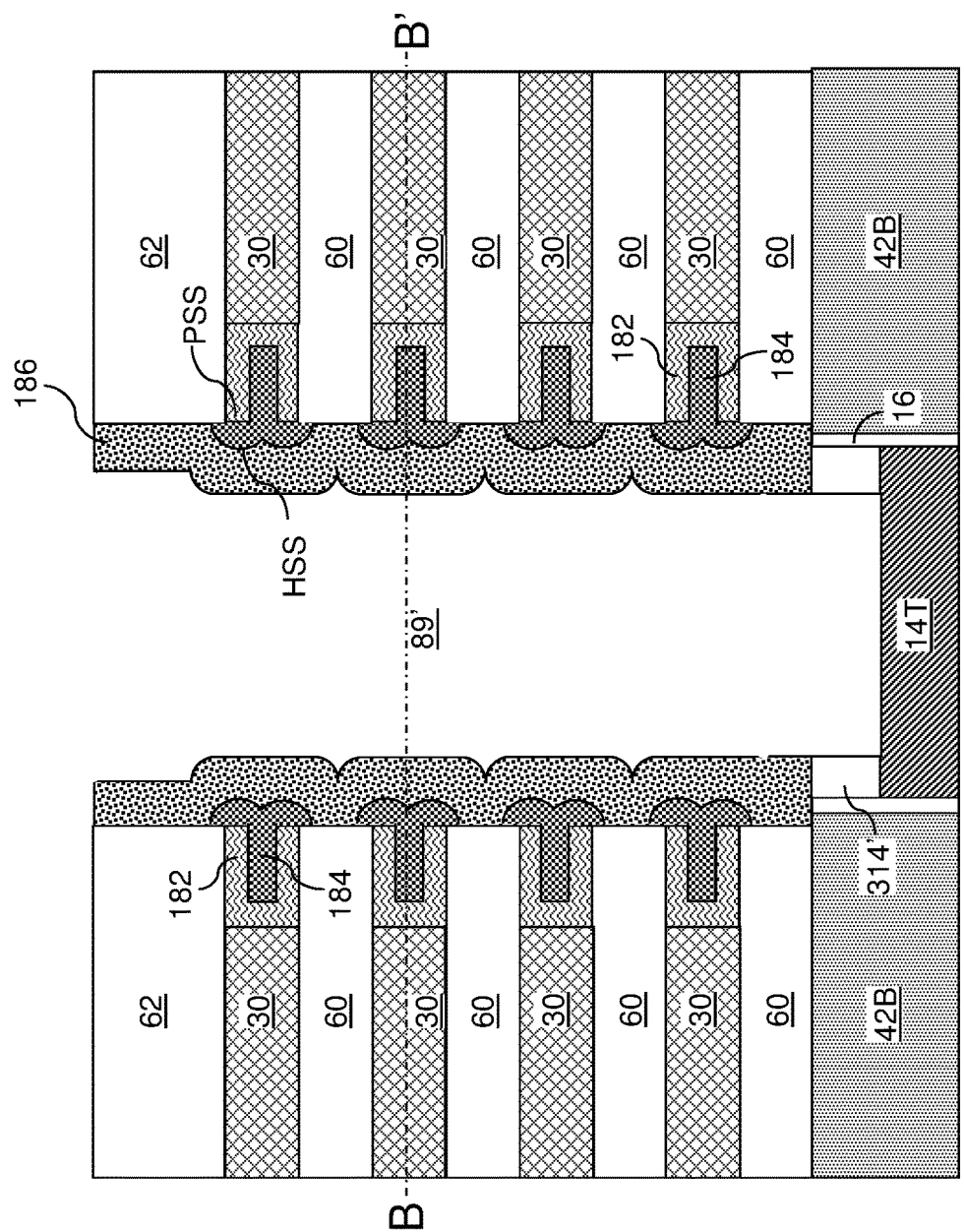
FIG. 14A is a vertical cross-sectional view of the exemplary structure after formation of resistive memory material layers by anisotropically etching the continuous memory element material layer according to an embodiment of the present disclosure.
Figure 14B:
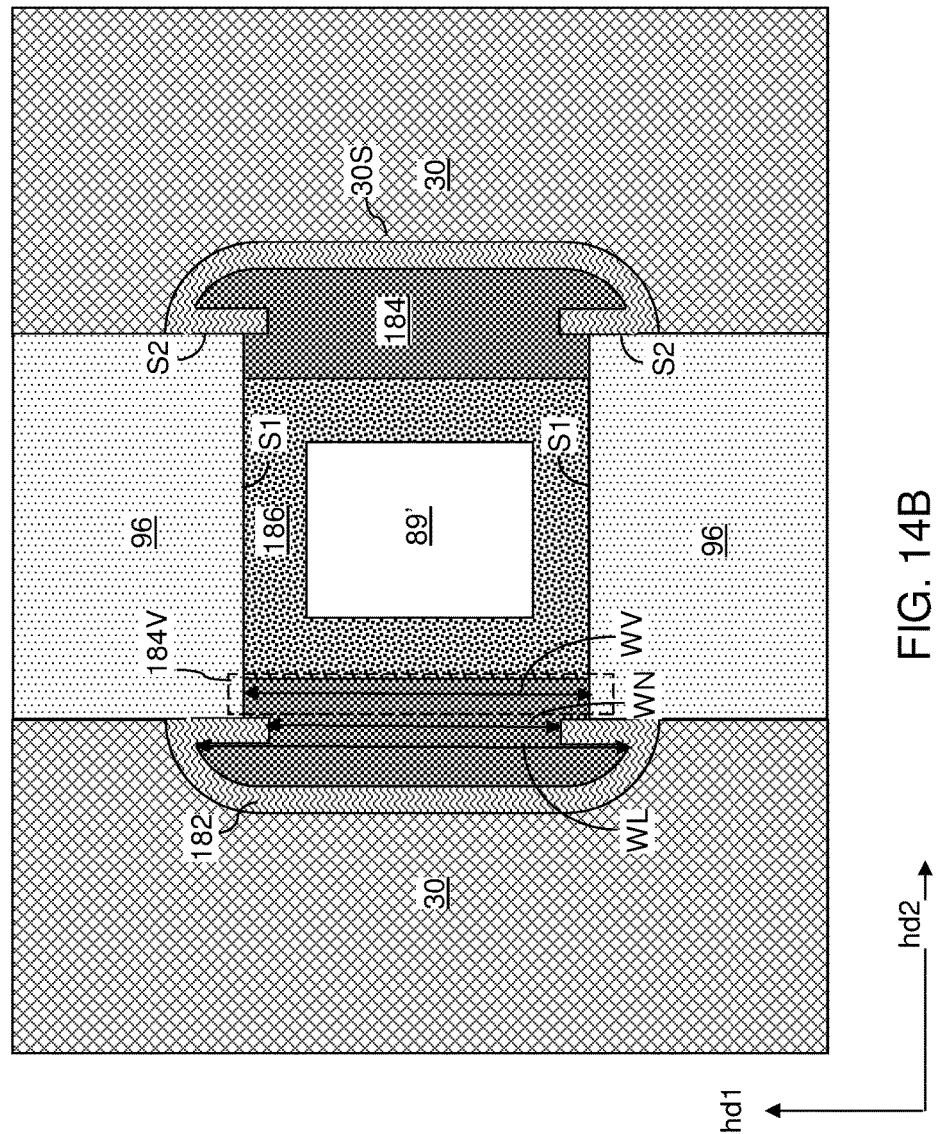
FIG. 14B is a horizontal cross-sectional view of the exemplary structure along the plane B-B' of FIG. 14A.

Referring to FIGS. 14A and 14B, an anisotropic etch process such as a reactive ion etch can be performed to remove horizontal portions of the continuous memory element material layer 186L. Each remaining portion of the continuous memory element material layer 186L has a generally tubular configuration, and is laterally bounded by a neighboring pair of alternating stacks (30, 60) of insulating material layers 60 and electrically conductive layers along the second horizontal direction hd2, and by a neighboring pair of dielectric pillar structures 96.

After removal of the horizontal portions of the continuous memory element material layer 186L, an etch process can be performed to remove physically exposed portions (i.e., portions that are not covered by the remaining vertical portions of the continuous memory element material layer 186L) of the sacrificial cap structures 314 from underneath the cavity 89'. An anisotropic etch or an isotropic etch can be performed, which can be selective to the materials of the remaining portions of the continuous memory element material layer 186L. The anisotropic etch or the isotropic etch may, or may not, be selective to the material of the insulating cap layers 62. The isotropic or anisotropic etch can recess the sacrificial cap structures 314 until the top surfaces of the semiconductor pillars 14 are physically exposed. In case an anisotropic etch is employed, each remaining portion of the sacrificial cap structures 314 can form a dielectric spacer ring 314'. Each cavity 89' can be vertically extended to the top surfaces of the top active regions 14T.

In case the material of the remaining portions of the continuous memory element material layer 186L needs to be annealed to become a resistive memory material, a crystallization anneal can be performed at an elevated temperature. The elevated temperature of the crystallization anneal can be in a range from 450° C. to 900° C., such as from 500° C. to 800° C. and/or from 550° C. to 750° C., although lower and higher temperatures can also be employed.

Each remaining tubular vertical portion of the continuous memory element material layer 186L can include a memory material after the anisotropic etch or after the crystallization anneal, in case the crystallization anneal is needed to convert an amorphous material into a crystalline resistive memory material. Thus, the resistive memory material layer 186 including a resistive memory material is provided within each memory opening 89 after the anisotropic etch and the optional crystallization anneal. The resistive memory material has at least two resistive states having different electrical resistivity. A resistive memory material layer 186 is formed on the vertically-extending portion 184V of each of the rivet-shaped middle electrodes 184. Each resistive memory material layer 186 can be formed on the at least one convex sidewall of each vertically-extending portion 184V within two vertical stacks of rivet-shaped middle electrodes 184 that are provided around the resistive memory material layer 186.

As shown in FIG. 14B, each resistive memory material layer 186 can be laterally bounded by a pair of dielectric pillar structures 96 that contact sidewalls of two alternating stacks (30, 60). The pair of dielectric pillar structures 96 can be laterally spaced from each other, and can contact two vertical stacks of discrete clam-shaped barrier material portions 182. The pair of dielectric pillar structures 96 can contact the vertically-extending portion 184V of each of the rivet-shaped middle electrodes 184 within two vertical stacks of rivet-shaped middle electrodes 184.

In one embodiment, the protrusion portion (184L, 184N) of each of the rivet-shaped middle electrodes 184 can be laterally spaced from the pair of dielectric pillar structures 96 by a respective one of the discrete clam-shaped barrier material portions 182. In one embodiment, the resistive memory material layer 186 has a shape of a vertically extending rectangular tube and contacts a first sidewall S1 of each of the pair of dielectric pillar structures 96. Each of the discrete clam-shaped barrier material portions 182 includes a vertically-extending portion 182V that contacts a sidewall 30S of a respective one of the electrically conductive layers 30 and a second sidewall S2 of each of the pair of dielectric pillar structures 96. In one embodiment shown in FIG. 14A, the vertically-extending portion 184V of the middle electrode 184 has a pair of protrusion-side sidewalls PSS that contact a respective one of the discrete clam-shaped barrier material portions 182 and a head-side sidewall HSS that contacts the resistive memory material layer 186. In one embodiment, each of the pair of protrusion-side sidewalls PSS contacts a sidewall of a respective one of the insulating layers 60.

Figure 15A:
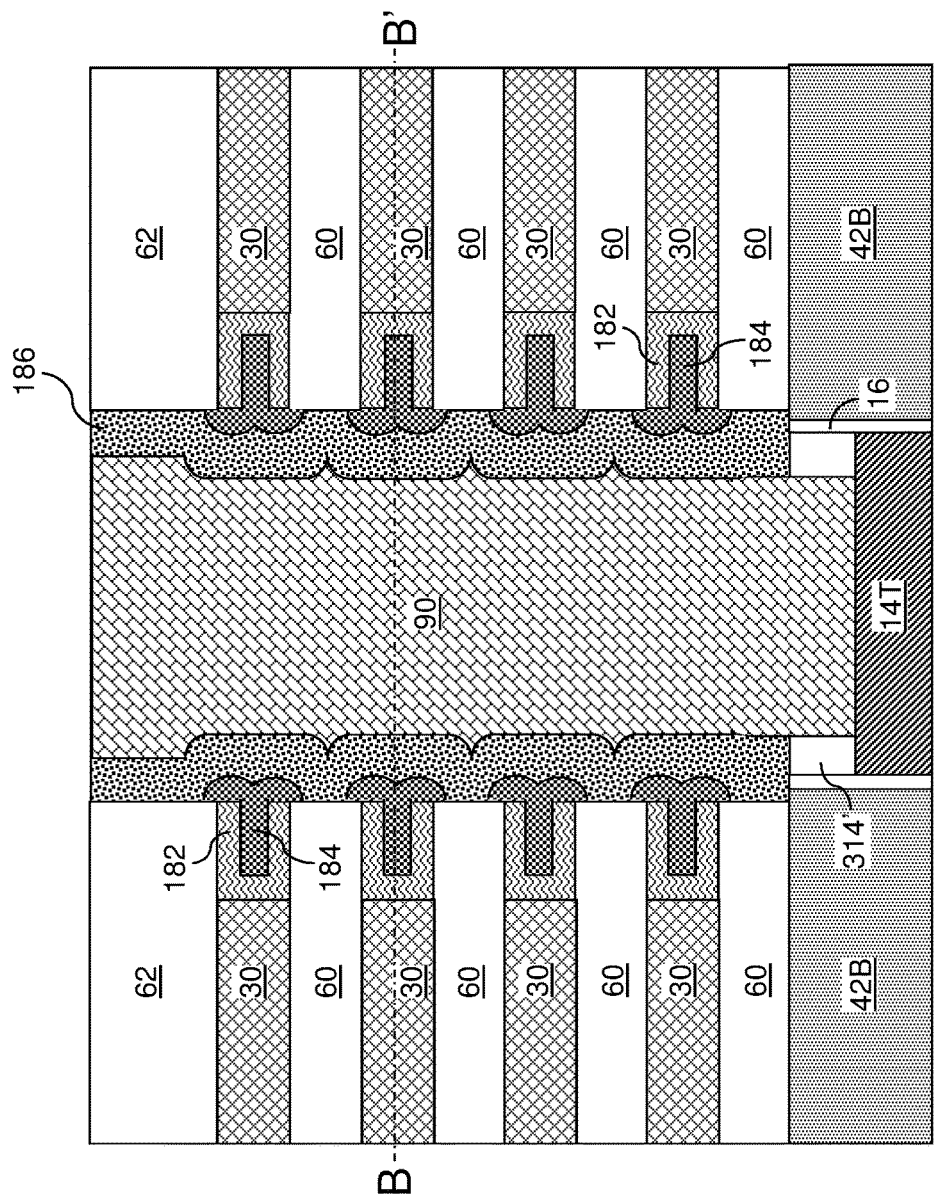
FIG. 15A is a vertical cross-sectional view of the exemplary structure after formation of a vertical conductive line according to an embodiment of the present disclosure.
Figure 15B:
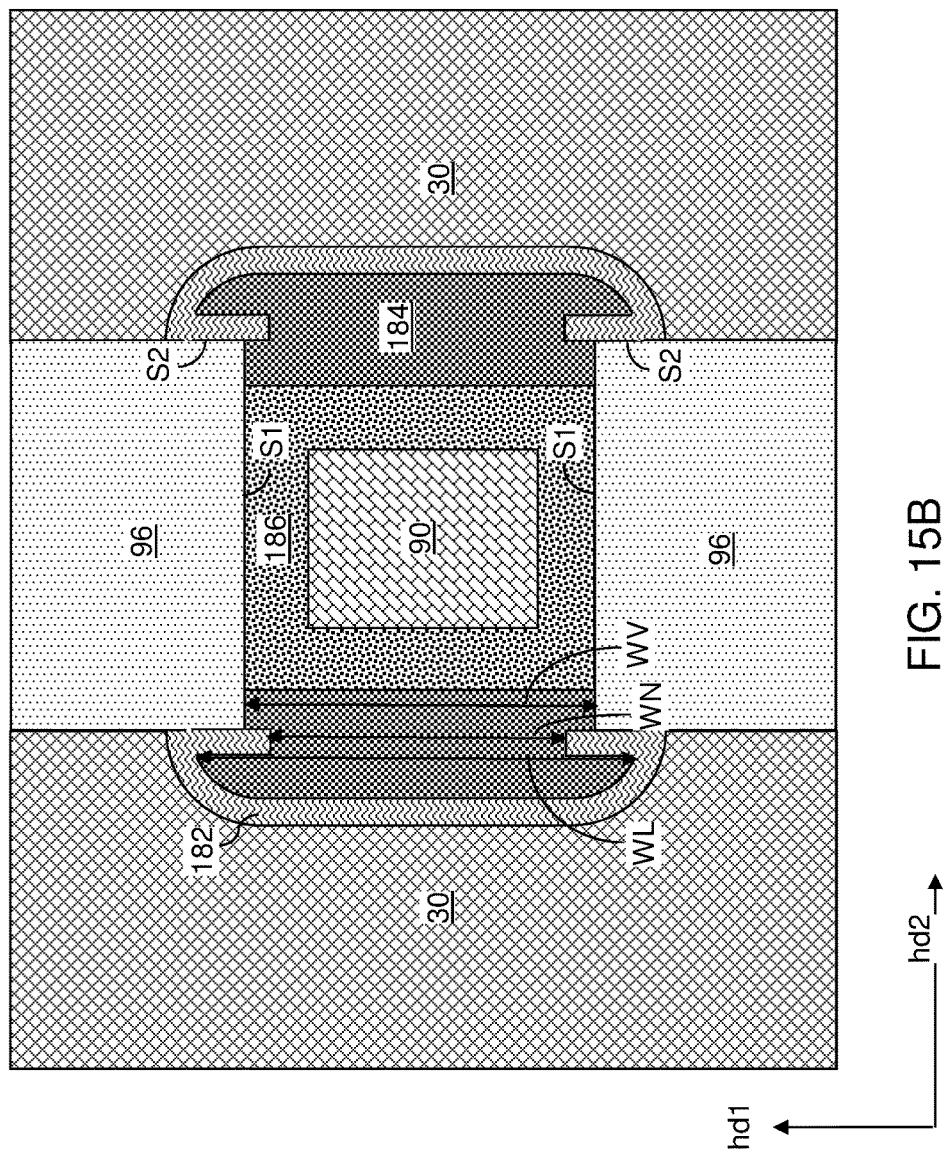
FIG. 15B is a horizontal cross-sectional view of the exemplary structure along the plane B-B' of FIG. 15A.

Referring to FIGS. 15A and 15B, a vertical conductive line 90 (e.g., local bit line which is electrically connected to the select transistor) can be formed in each cavity 89' by deposition of at least one conductive material in the cavities 89'. The at least one conductive material can include a heavily doped semiconductor material (such as heavily doped polysilicon) and/or at least one metallic material (such as a combination of a metal nitride liner (e.g., TiN) and a metal fill material (e.g., W)). Excess portions of the at least one conductive material can be removed from above the horizontal plane including the top surfaces of the insulating cap layer 62 by a planarization process. The planarization process can employ a recess etch process and/or chemical mechanical planarization.

Each vertical conductive line 90 can be formed on the top surface of a top active region 14T and on laterally undulating inner sidewalls of a resistive memory material layer 186. The vertical conductive line 90 can be laterally spaced from a pair of dielectric pillar structures 96 by the resistive memory material layer 186.

Figure 16:
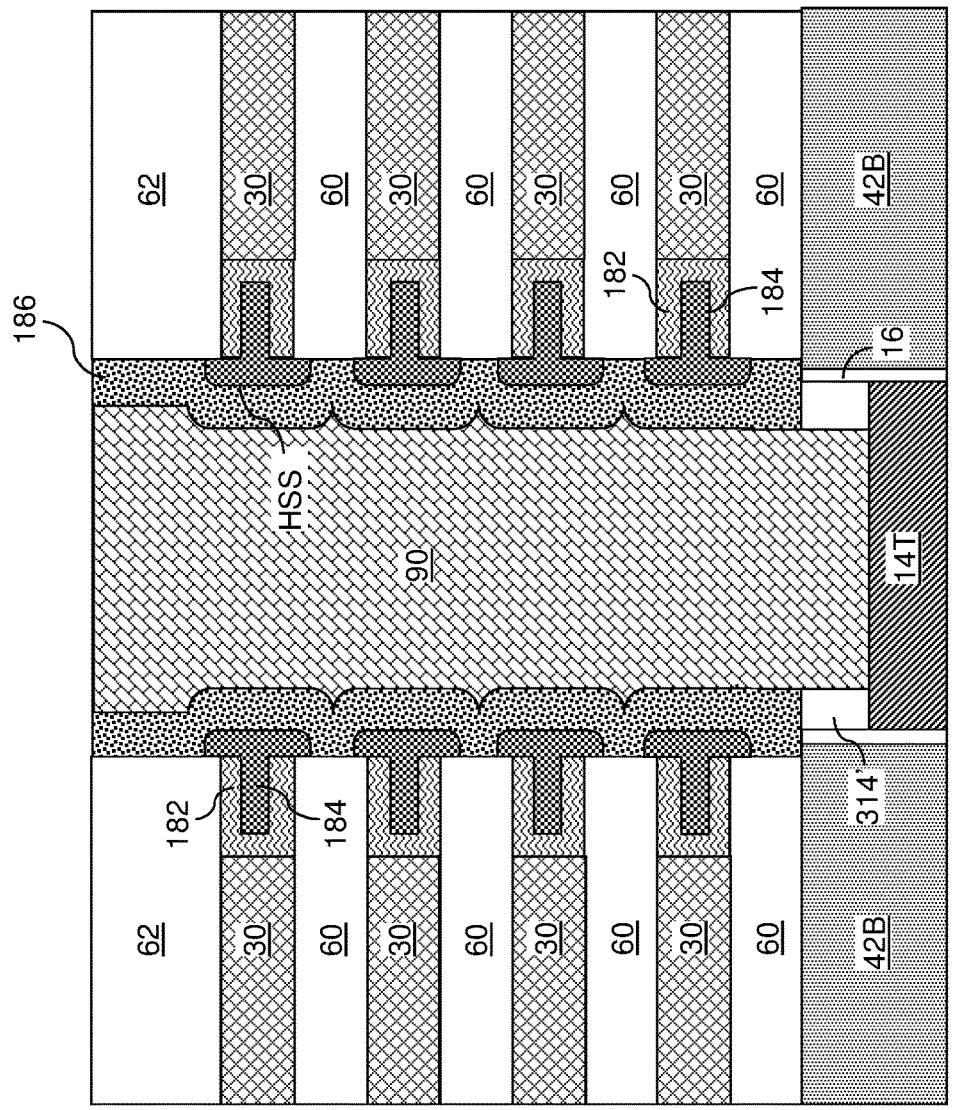
FIG. 16 is a vertical cross-sectional view of a first alternative embodiment of the exemplary structure.

Referring to FIG. 16, a first alternative embodiment of the exemplary structure can be derived from the exemplary structure by forming a substantially vertical surfaces (e.g., surfaces which deviate by 0 to 10 degrees from the vertical direction) as a portion of each head-side sidewall HSS of the rivet-shaped middle electrodes 184 prior to deposition of the continuous memory element material layer 186L. The substantially vertical surface can be formed by decreasing the vertical separation distance between the upper and lower horizontally-extending portions (182U, 182W) of a discrete clam-shaped barrier material portion 182. Additionally or alternatively, the lateral thickness of the vertically-extending portion 184V of the rivet-shaped middle electrodes 184 can be increased to provide the substantially vertical surface of the head-side sidewalls HSS. Additionally or alternatively, an anisotropic etch process can be performed to remove convex regions of the vertically-extending portion 184V of the rivet-shaped middle electrodes 184 prior to deposition of the continuous memory element material layer 186L.

Figure 17:
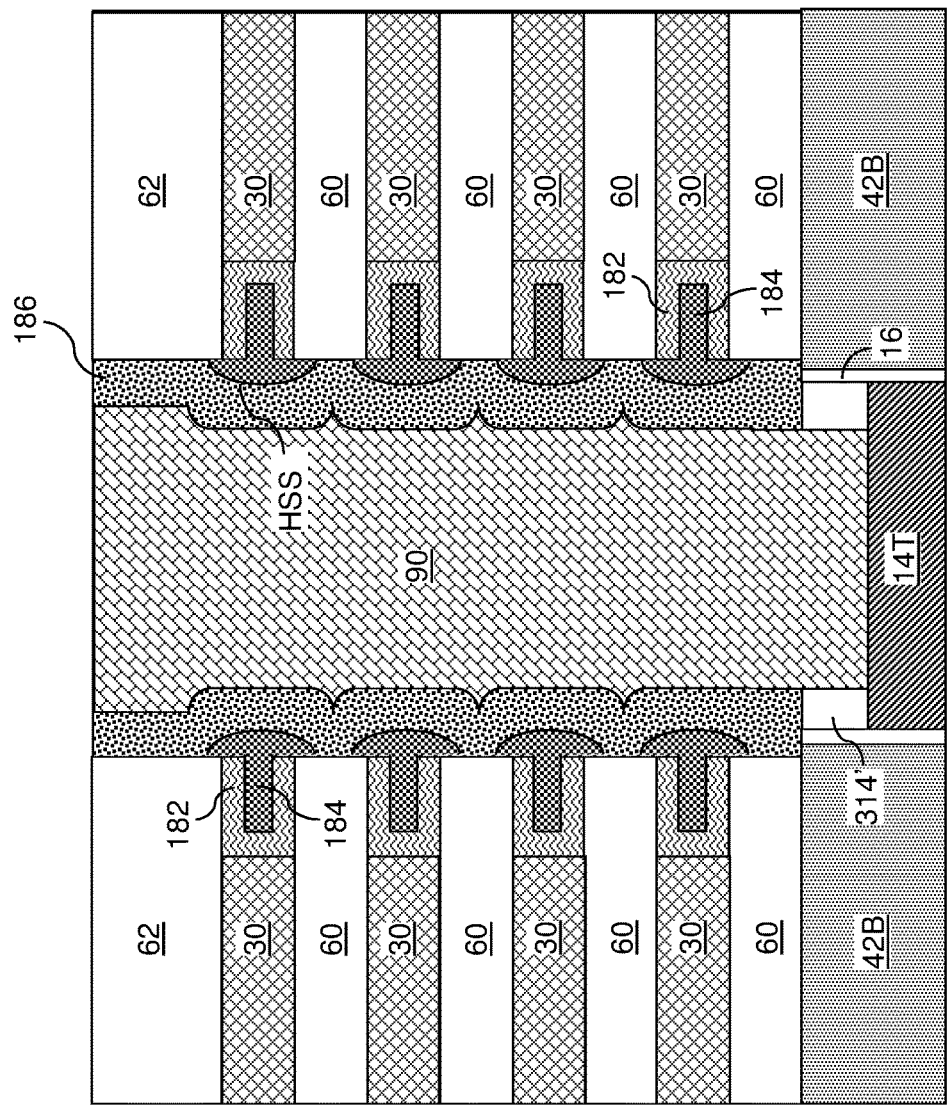
FIG. 17 is a vertical cross-sectional view of a second alternative embodiment of the exemplary structure.

Referring to FIG. 17, a second alternative embodiment of the exemplary structure can be derived from the exemplary structure by forming a single convex surface on each head-side sidewall HSS prior to deposition of the continuous memory element material layer 186L. In this case, the vertically-extending portion 184V of a the rivet-shaped middle electrodes 184 can have a head-side sidewall HSS that includes a single convex surface having a closed periphery that adjoins sidewalls of two insulating layers 60 and sidewalls of two dielectric pillar structures 96.

Figure 18:
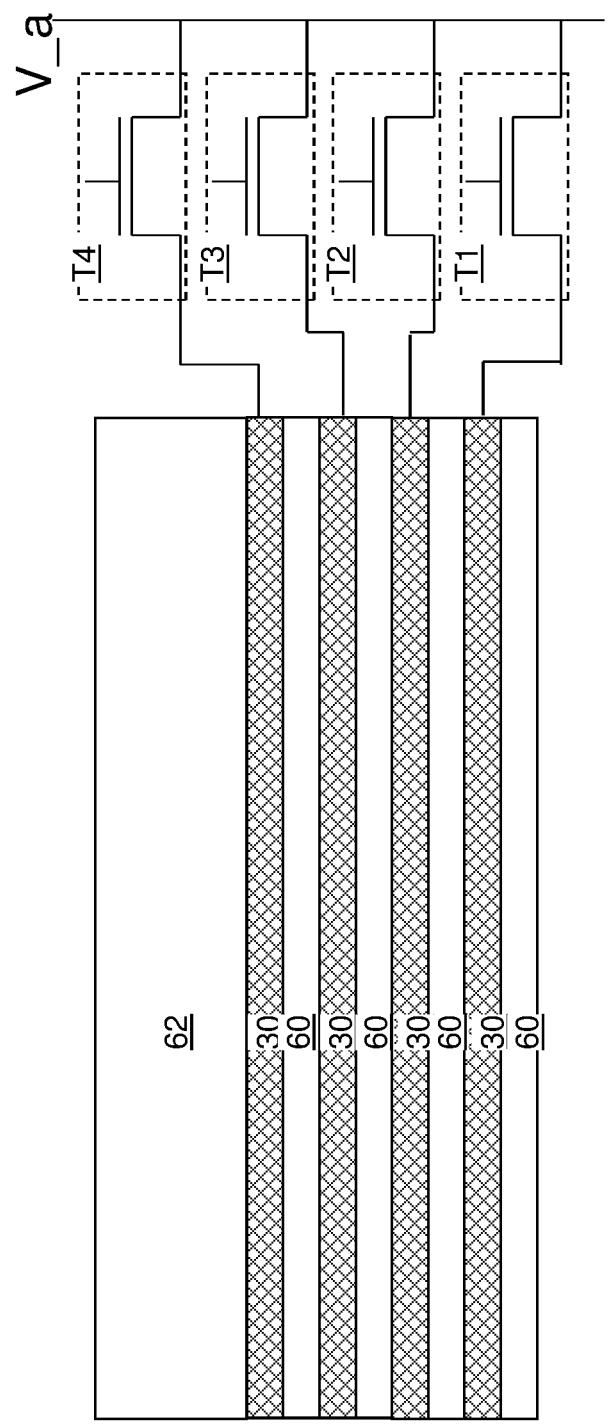
FIG. 18 is a schematic illustrating electrical connection between the electrically conductive layers as word lines and word line access transistors according to an embodiment of the present disclosure.

As shown in FIG. 18, word line select transistors (T1-T4) for selectively activating a respective electrically conductive layer 30 (which functions as a word line) can be formed at any suitable stage of the processing sequence. For example, the word line select transistors can be formed in, or on, the substrate 8 if the substrate 8 includes a semiconductor substrate. Alternatively or additionally, the word line select transistors can be formed prior to, concurrently with, or after formation of the vertical field effect transistors (14, 16, 18). Alternatively or additionally, the word line select transistors can be formed prior to, or after, formation of the vertical conductive lines 90. Any method for forming transistors as known in the art can be employed to provide the second select transistors. A switched node (e.g., a source region or a drain region) of each second select transistor can be connected to an end of a respective electrically conductive layer 30, and another node (e.g., a drain region or a source region) can be connected to a voltage source (or current source) which provides a node activation voltage V_a.

In one embodiment, each global bit line 10 laterally extends along the second horizontal direction hd2, and two or more of the vertical field effect transistors (14, 16, 18) can be electrically connected to the global bit line 10. The vertical field effect transistors (14, 16, 18) are configured to activate a selected vertical conductive line 90 by supplying an activation voltage thereto from a respective global bit line 10, and the word line select transistors (T1-T4) are configured to activate a selected electrically conductive layer 30 by supplying another activation voltage thereto. In one embodiment, the exemplary structure can include a monolithic three-dimensional memory device comprises a resistive random access memory (ReRAM) device.

Referring collectively to all drawings of the present disclosure, embodiments of the present disclosure provide a resistive memory device. The resistive memory device can comprise: an alternating stack (30, 60) of insulating layers 60 and electrically conductive layers 30 that extend along a first horizontal direction hd1, wherein sidewalls of the electrically conductive layers 30 are laterally recessed relative to sidewalls of the insulating layers 60 to define laterally recessed regions 89R; discrete clam-shaped barrier material portions 182 located within a respective one of the laterally recessed regions 89R and vertically spaced apart by the insulating layers 60; middle electrodes 184 contacting a respective one of the discrete clam shaped barrier material portions 182, wherein each of the middle electrodes 184 includes a protrusion portion (184L, 184N) located inside a respective one of the laterally recessed regions 89R and embedded within a respective one of the discrete clam shaped barrier material portions 182, and further includes a vertically-extending portion 184V located outside the laterally recessed regions 89R and having a greater vertical extent HV than the protrusion portion (184L, 184N); a resistive memory material layer 186 comprising a resistive material having at least two resistive states having different electrical resistivity and contacting the vertically-extending portion 184V of each of the middle electrodes 184; and a vertical conductive line 90 contacting the resistive memory material layer 186.

The middle electrodes 184 provide structural uniformity, stability against process variations and enhanced device stability. By selectively depositing the middle electrodes 184, the metal etching step is eliminated, simplifying the process. Furthermore, the vertically-extending portion 184V provides a homogeneous boundary to the resistive memory material layer 186 to reduce or avoid heterogeneous dents or voids in the resistive memory material layer 186, which improves the device yield.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device comprising:
    an alternating stack of insulating layers and electrically conductive layers that extend along a first horizontal direction, wherein sidewalls of the electrically conductive layers are laterally recessed relative to sidewalls of the insulating layers to define laterally recessed regions;
    discrete clam-shaped barrier material portions located within a respective one of the laterally recessed regions and vertically spaced apart by the insulating layers;
    middle electrodes contacting a respective one of the discrete clam shaped barrier material portions, wherein each of the middle electrodes includes a protrusion portion located inside a respective one of the laterally recessed regions and embedded within a respective one of the discrete clam shaped barrier material portions, and further includes a vertically-extending portion located outside the laterally recessed regions and having a greater vertical extent than the protrusion portion;
    a resistive memory material layer comprising a resistive material having at least two resistive states having different electrical resistivity and contacting the vertically-extending portion of each of the middle electrodes; and
    a vertical conductive line contacting the resistive memory material layer.

2. The resistive memory device of claim 1, wherein:
    the middle electrodes consist essentially of an elemental metal selected from tungsten and aluminum;
    the electrically conductive layers comprise word lines; and
    the vertical conductive line comprises a local bit line.

3. The resistive memory device of claim 1, wherein the vertically-extending portion has a head-side sidewall that contacts the resistive memory material layer and a protrusion-side sidewall that contacts a respective one of the discrete clam-shaped barrier material portions and including a portion that is parallel to the head-side sidewall.

4. The resistive memory device of claim 3, wherein the protrusion-side sidewall contacts a sidewall of a respective one of the insulating layers.

5. The resistive memory device of claim 3, wherein each of the discrete clam-shaped barrier material portions includes:
    an upper horizontally-extending portion overlying a protrusion portion of a respective one of the middle electrodes;
    a lower horizontally-extending portion underlying the protrusion portion of the respective one of the middle electrodes; and
    a vertically-extending portion connecting the upper and lower horizontally-extending portions.

6. The resistive memory device of claim 5, wherein:
    the protrusion portion of the respective one of the middle electrodes has a vertical thickness that is the same as a vertical separation distance between the upper and lower horizontally-extending portions; and
    the vertically-extending portion is connected to the protrusion portion and has a vertical extent that is greater than a vertical separation distance between a top surface of the upper horizontally-extending portion and a bottom surface of the lower horizontally-extending portion.

7. The resistive memory device of claim 1, wherein a maximum lateral width of the protrusion portion is greater than a maximum lateral width of the vertically-protruding portion for each of the middle electrodes.

8. The resistive memory device of claim 1, wherein:
    the middle electrode is a rivet-shaped middle electrode; and
    the protrusion portion of each of the rivet-shaped middle electrodes includes:
        a laterally-extending portion having a pair of vertical convex sidewalls and having a maximum lateral width that is the same as the maximum lateral width of the protrusion portion; and
        a neck portion having a lesser maximum lateral width than the laterally-extending portion and connecting the laterally-extending portion to a respective vertically-extending portion.

9. The resistive memory device of claim 1, wherein the vertically-extending portion of each of the middle electrodes has a head-side sidewall that includes a pair of convex surfaces that are adjoined to each other or a single convex surface having a closed periphery that adjoins sidewalls of two of the insulating layers.

10. The resistive memory device of claim 1, further comprising a pair of dielectric pillar structures that contact sidewalls of the alternating stack, that are laterally spaced from each other, and that contacts the discrete clam-shaped barrier material portions and the vertically-extending portion of each of the middle electrodes.

11. The resistive memory device of claim 10, wherein:
    the protrusion portion of each of the middle electrodes is laterally spaced from the pair of dielectric pillar structures by a respective one of the discrete clam-shaped barrier material portions; and the vertical conductive line is laterally spaced from the pair of dielectric pillar structures by the resistive memory material layer.

12. The resistive memory device of claim 11, wherein:

the resistive memory material layer has a shape of a vertically extending rectangular tube and contacts a first sidewall of each of the pair of dielectric pillar structures; and each of the discrete clam-shaped barrier material portions includes a vertically extending portion that contacts a sidewall of a respective one of the electrically conductive layers and a second sidewall that contacts each of the pair of dielectric pillar structures.

13. A method of forming a resistive memory device, comprising:

forming an alternating stack of insulating layers and electrically conductive layers that extend along a first horizontal direction over a substrate;

forming laterally recessed regions by laterally recessing sidewalls of the electrically conductive layers relative to sidewalls of the insulating layers;

forming discrete clam-shaped barrier material portions within the laterally recessed regions, wherein a laterally-extending cavity is present within each of the laterally recessed regions after formation of the discrete clam-shaped barrier material portions;

forming middle electrodes on the discrete clam shaped barrier material portions, wherein each of the middle electrodes includes a protrusion portion located inside a respective one of the laterally recessed regions and embedded within a respective one of the discrete clam shaped barrier material portions, and further includes a vertically-extending portion located outside the laterally recessed regions and having a greater vertical extent than the embedded portion;

forming a resistive memory material layer comprising a resistive material having at least two resistive states having different electrical resistivity on the vertically-extending portion of each of the middle electrodes; and forming a vertical conductive line on the resistive memory material layer.

14. The method of claim 13, wherein the middle electrodes are formed by selective deposition of a metallic material in which the metallic material selectively grows from surfaces of the discrete clam-shaped barrier material portions and does not substantially grow from surfaces of the insulating layers.

15. The method of claim 14, wherein the selective deposition of the metallic material is a chemical vapor deposition process or an atomic layer deposition process in which a material of the discrete clam-shaped barrier material portions reacts with a precursor gas to form a nucleation material layer containing the metallic material, and subsequent deposition of the metallic material after formation of the nucleation material layer proceeds only from surfaces of the nucleation material layer and does not proceed from surfaces of the insulating layer.

16. The method of claim 15, wherein:

the middle electrodes consist essentially of tungsten;

the discrete clam-shaped barrier material portions comprise silicon or a silicon-containing compound; and the chemical vapor deposition process or the atomic layer deposition process that forms the nucleation material layer employs a fluorine-containing tungsten precursor gas or a hydrogen-containing tungsten precursor gas that combines with silicon atoms to deposit the tungsten nucleation material layer with release of a fluorine-containing gas or a hydrogen-containing gas.

17. The method of claim 13, wherein the middle electrodes consist essentially of aluminum.

18. The method of claim 13, wherein the discrete clam shaped barrier material portions are formed by:

conformally depositing a barrier material layer in the laterally recessed regions and on the sidewalls of the insulating layers; and anisotropically etching portions of the barrier material layer that are located outside the laterally recessed regions, wherein remaining portions of the barrier material layer in the laterally recessed regions constitute the discrete clam-shaped barrier material portions.

19. The method of claim 13, further comprising forming a pair of dielectric pillar structures on the sidewalls of the electrically conductive layers and on the sidewalls of the insulating layers, wherein:

the pair of dielectric pillar structures is laterally spaced from each other;

the sidewalls of the electrically conductive layers are laterally recessed employing an isotropic etch process that is selective to a material of the pair of dielectric pillar structures;

the laterally recessed regions are bounded by concave sidewalls of the electrically conductive layers that adjoin the pair of dielectric pillar structures;

the protrusion portion of each of the middle electrodes is laterally spaced from the pair of dielectric pillar structures by a respective one of the discrete clam-shaped barrier material portions; and the vertically-extending portion of each of the middle electrodes contacts sidewalls of the pair of dielectric pillar structures.

* * * * *